United States Patent
Baik et al.

(10) Patent No.: US 10,964,765 B2
(45) Date of Patent: *Mar. 30, 2021

(54) ORGANIC LIGHT EMITTING DISPLAY DEVICE, HEAD MOUNTED DISPLAY INCLUDING THE SAME AND METHOD OF FABRICATING THE SAME

(71) Applicant: LG Display Co., Ltd., Seoul (KR)

(72) Inventors: Seung-Min Baik, Paju-si (KR); Joon-Young Heo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/843,589

(22) Filed: Apr. 8, 2020

(65) Prior Publication Data

US 2020/0235179 A1    Jul. 23, 2020

Related U.S. Application Data

(63) Continuation of application No. 16/104,048, filed on Aug. 16, 2018, now Pat. No. 10,680,045.

(30) Foreign Application Priority Data

Aug. 16, 2017 (KR) ........................ 10-2017-0103687

(51) Int. Cl.
*H01L 27/32* (2006.01)
*H01L 51/52* (2006.01)

(52) U.S. Cl.
CPC ...... *H01L 27/3246* (2013.01); *H01L 27/3258* (2013.01); *H01L 51/5278* (2013.01);
(Continued)

(58) Field of Classification Search
None
See application file for complete search history.

(56) References Cited

U.S. PATENT DOCUMENTS

| 6,091,078 A | 7/2000 | Codama |
| 8,981,352 B2 | 3/2015 | Yamada et al. |

(Continued)

FOREIGN PATENT DOCUMENTS

| CN | 102738200 A | 10/2012 |
| CN | 103779470 A | 5/2014 |

(Continued)

OTHER PUBLICATIONS

China National Intellectual Property Administration, First Office Action, CN Patent Application No. 201810934904.X, dated Apr. 10, 2020, pp. 1-24.

(Continued)

*Primary Examiner* — Benjamin P Sandvik
(74) *Attorney, Agent, or Firm* — Fenwick & West LLP

(57) ABSTRACT

An organic light emitting display device includes: an insulating layer; first electrodes on the insulating layer and spaced from each other by a gap; an organic light emitting layer on the first electrodes; and a second electrode on the organic light emitting layer, wherein the insulating layer includes a trench between the first electrodes, wherein the organic light emitting layer includes a first stack on the first electrodes, a charge generating layer on the first stack, and a second stack on the charge generating layer, wherein each of the first and second stacks includes a hole transporting layer, at least one emitting material layer and an electron transporting layer, and wherein the first stack has a discontinuous portion in the trench.

18 Claims, 30 Drawing Sheets

(52) U.S. Cl.
CPC ........ *H01L 27/322* (2013.01); *H01L 27/3209* (2013.01); *H01L 27/3248* (2013.01); *H01L 51/5218* (2013.01); *H01L 2227/323* (2013.01); *H01L 2251/5392* (2013.01)

(56) References Cited

U.S. PATENT DOCUMENTS

| | | | |
|---|---|---|---|
| 10,680,045 B2 * | 6/2020 | Baik | ............... H01L 27/3246 |
| 2007/0014916 A1 | 1/2007 | Daniels | |
| 2012/0181525 A1 | 7/2012 | Sugimoto et al. | |
| 2014/0103385 A1 | 4/2014 | Hatano et al. | |
| 2015/0357388 A1 | 12/2015 | Pang | |
| 2016/0118451 A1 | 4/2016 | Youn et al. | |
| 2017/0271421 A1 | 9/2017 | Jinbo et al. | |
| 2018/0123081 A1 | 5/2018 | Baik et al. | |
| 2019/0096971 A1 | 3/2019 | Ukigaya | |

FOREIGN PATENT DOCUMENTS

| | | |
|---|---|---|
| CN | 104659070 A | 5/2015 |
| CN | 105679802 A | 6/2016 |
| JP | 2013-134813 A | 7/2013 |
| JP | 2014-082132 A | 5/2014 |
| KR | 10-2012-0112067 A | 10/2012 |

OTHER PUBLICATIONS

United States Office Action, U.S. Appl. No. 16/104,048, dated Oct. 8, 2019, 15 pages.

United States Office Action, U.S. Appl. No. 16/104,048, dated Jul. 1, 2019, 14 pages.

Korean Intellectual Property Administration, Office Action, KR Patent Application No. 10-2017-0103687, Feb. 22, 2021, ten pages.

* cited by examiner

ORGANIC LIGHT EMITTING DISPLAY DEVICE, HEAD MOUNTED DISPLAY INCLUDING THE SAME AND METHOD OF FABRICATING THE SAME

CROSS-REFERENCE TO RELATED APPLICATIONS

The present application is a continuation of U.S. application Ser. No. 16/104,048 filed on Aug. 16, 2018 which claims the benefit of priority of Korean Patent Application No. 10-2017-0103687 filed in the Republic of Korea on Aug. 16, 2017, all of which are hereby incorporated by reference in their entirety for all purposes as if fully set forth herein.

BACKGROUND OF THE INVENTION

Field of the Invention

The present disclosure relates to an organic light emitting display device, and more particularly to an organic light emitting display device, a head mounted display including the organic light emitting display device and a method of fabricating the organic light emitting display device.

Description of the Related Art

As the information age progresses, display devices processing and displaying a large amount of information have rapidly advanced. Recently, various display devices such as a liquid crystal display (LCD) device, a plasma display panel (PDP) device and an organic light emitting display (OLED) device have been utilized.

Among various display devices, the OLED device of an emissive type device has advantages of a viewing angle and a contrast ratio as compared with the LCD device. Since an additional backlight unit is not required, the OLED device has a light weight, a thin profile and a low power consumption. In addition, the OLED device is driven with a low direct current voltage and has a fast response speed. Specifically, the OLED device has a low fabrication cost.

The OLED device includes an anode, a bank layer dividing the anode, a hole transporting layer (HTL) on the anode, an organic light emitting layer on the HTL, an electron transporting layer (ETL) on the organic light emitting layer and a cathode on the ETL. When a high level voltage and a low level voltage are applied to the anodes and the cathode, respectively, a hole and an electron move to the organic light emitting layer through the HTL and the ETL, respectively, and are combined with each other to emit a light.

Recently, a head mounted display (HMD) including the OLED device has been developed. The HMD may be a glass type monitor for a virtual reality (VR) or an augmented reality (AR) where a focus is formed at a close distance to an eye of a user. The user may wear the HMD as a glass or a helmet. A small sized OLED device of a high resolution may be applied to the HMD. The small sized OLED device of a high resolution may be an organic light emitting diode on silicon (OLEDoS) through a semiconductor process for a wafer. An anode is formed on an insulating layer covering a transistor formed on a wafer, and a current flows through an organic light emitting layer on the anode to cause a side leakage current. In addition, since the organic light emitting layer is not uniformly formed at an edge of the anode due to a step difference between the anode and the insulating layer, the anode may be connected to the cathode or a charge generating layer of the organic light emitting layer.

SUMMARY OF THE INVENTION

Accordingly, the present disclosure is directed to an organic light emitting display device, a head mounted display including the same and a method of fabricating the same that substantially obviate one or more of problems due to limitations and disadvantages of the prior art.

In accordance with the present disclosure, as embodied and broadly described herein, the present disclosure provides an organic light emitting display device where a shortage of an anode to a cathode or a charge generating layer of an organic light emitting layer and a side leakage current are prevented, a head mounted display including the organic light emitting display device and a method of fabricating the organic light emitting display device.

In another aspect, the present disclosure provides an organic light emitting display device including: an insulating layer; first electrodes disposed on the insulating layer and spaced from each other by a gap; an organic light emitting layer on the first electrodes; and a second electrode on the organic light emitting layer, wherein the insulating layer includes a trench in the gap between the first electrodes, wherein the organic light emitting layer includes a first stack on the first electrodes, a charge generating layer on the first stack, and a second stack on the charge generating layer, wherein each of the first and second stacks includes a hole transporting layer, at least one emitting material layer and an electron transporting layer, and wherein the first stack has a discontinuous portion in the trench.

In another aspect, the present disclosure provides a head mounted display including: a display case; a left eye lens and a right eye lens in the display case; at least one organic light emitting display device providing at least one image to the left eye lens and the right eye lens; and a head band connected to the display case, wherein the at least one organic light emitting display device includes: an insulating layer; first electrodes disposed on the insulating layer and spaced from each other by a gap; an organic light emitting layer on the first electrodes; and a second electrode on the organic light emitting layer, wherein the insulating layer includes a trench in the gap between the first electrodes, wherein the organic light emitting layer includes a first stack on the first electrodes, a charge generating layer on the first stack, and a second stack on the charge generating layer, wherein each of the first and second stacks includes a hole transporting layer, at least one emitting material layer and an electron transporting layer, and wherein the first stack has a discontinuous portion in the trench.

In another aspect, the present disclosure provides a method of fabricating an organic light emitting display device including: forming an insulating layer on a substrate; forming first electrodes on the insulating layer, the first electrodes spaced from each other by a gap; forming an organic light emitting layer on the first electrodes; and forming a second electrode on the organic light emitting layer, wherein the insulating layer includes a trench in the gap between the first electrodes, wherein the organic light emitting layer includes a first stack on the first electrodes, a charge generating layer on the first stack, and a second stack on the charge generating layer, wherein each of the first and second stacks includes a hole transporting layer, at least one emitting material layer and an electron transporting layer, and wherein the first stack has a discontinuous portion in the trench.

In another aspect, the present disclosure provides an organic light emitting display device including: a first sub-pixel including a first electrode of the first sub-pixel covering an insulating layer of the first sub-pixel; a second sub-pixel including a first electrode of the second sub-pixel covering an insulating layer of the second sub-pixel; and a trench between the first sub-pixel and the second sub-pixel that extends down through at least part of an insulating layer between the first sub-pixel and the second sub-pixel, wherein the insulating layer of the first sub-pixel, the insulating layer of the second sub-pixel, and the insulating layer between the first sub-pixel and the second sub-pixel are part of a same layer, wherein the organic light emitting layer includes a first stack on the first electrodes, a charge generating layer on the first stack, and a second stack on the charge generating layer, wherein each of the first and second stacks includes a hole transporting layer, at least one emitting material layer and an electron transporting layer, and wherein the first stack has a discontinuous portion in the trench.

It is to be understood that both the foregoing general description and the following detailed description are exemplary and explanatory and are intended to provide further explanation of the embodiments as claimed.

BRIEF DESCRIPTION OF THE DRAWINGS

The accompanying drawings, which are included to provide a further understanding of the disclosure and are incorporated in and constitute a part of this specification, illustrate embodiments and together with the description serve to explain the principles of the disclosure. In the drawings.

DETAILED DESCRIPTION OF THE PREFERRED EMBODIMENTS

Figure 1:
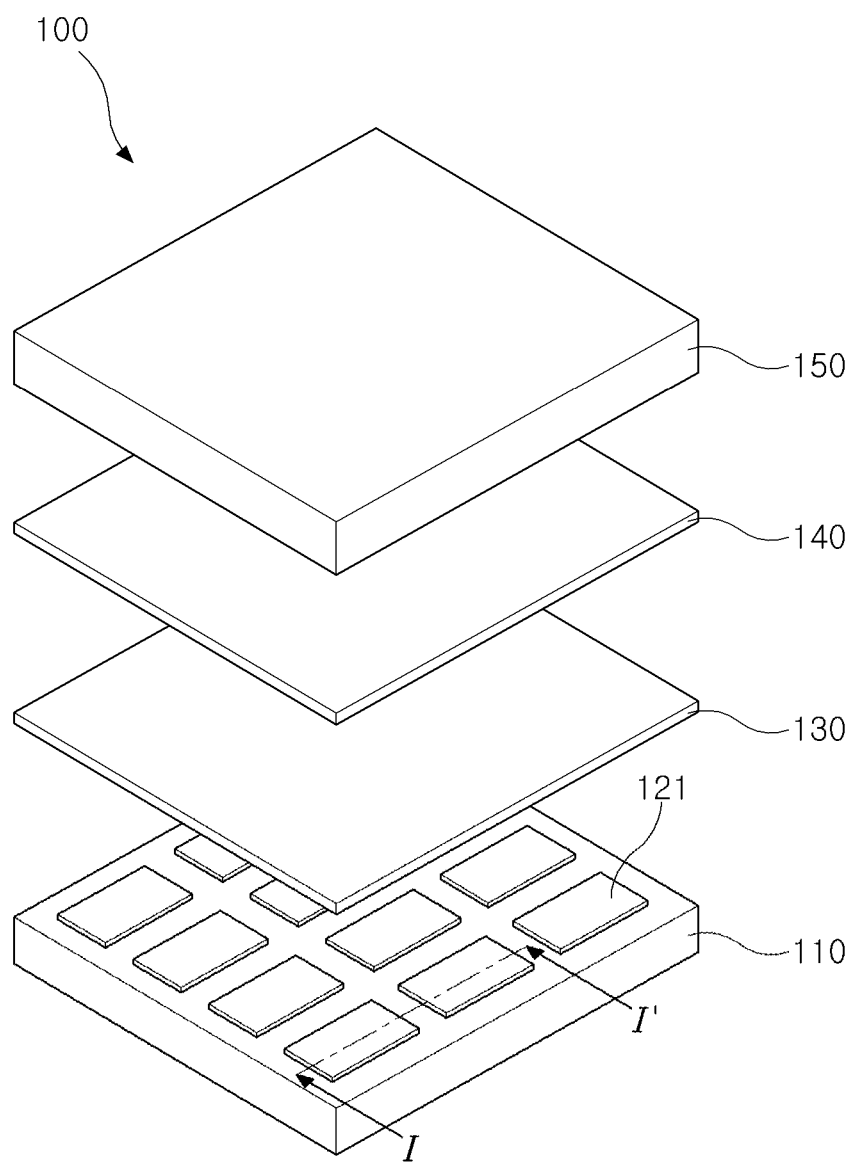
FIG. 1 is a perspective view showing an organic light emitting display device according to one or more embodiments of the present disclosure.

Hereinafter, some embodiments of the present disclosure will be described in detail with reference to the accompanying illustrative drawings. In designating elements of the drawings by reference numerals, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

Since a shape, a size, a ratio, an angle and a number shown in drawings for illustrating embodiments of the present disclosure are exemplary, the present disclosure will not be limited to contents of the drawings.

In the case that it is described that a certain structural element "include," "have" and "is composed of," another elements may be added except for the case where "only" is used. An element expressed as a singularity includes a plurality except for the case having a specific description.

When an element is construed, the element includes an error range even without a specific description.

When a position relation of two parts is illustrated with "on," "over," "under" and "side," at least one part may be disposed between the two parts except for the case using "straightly" and "directly."

When a time relation is illustrated with "after," "subsequently," "next" and "before," a case which is not sequential may be included except for the case using "straightly" and "directly."

Although a first and a second may be used for illustrating various elements, the elements are not limited by the word. The word is used for distinguish one element from the other elements. Accordingly, a first element may be a second element within a scope of the spirit of the present disclosure hereinafter.

A relation of "an X axis direction," "a Y axis direction" and "a Z axis direction" is not interpreted as a geometrical vertical relation, the relation may be interpreted to have a wide directionality within a range where the present disclosure operates functionally.

A word of "at least one" should be construed to include all combinations suggested from at least one relating items. For example, "at least one of a first item, a second item and a third item" may mean all combinations suggested from two or more of the first, second and third items as well as each of the first, second and third items.

Characteristics of various embodiments of the present disclosure may be combined or united partially or wholly and may be technically communicated and driven. The embodiments may be implemented independently or together.

FIG. 1 is a perspective view showing an organic light emitting display device according to one or more embodiments of the present disclosure. Although an organic light emitting display (OLED) device is illustrated as an organic light emitting diode on silicon (OLEDoS) where an organic light emitting diode is formed on a wafer through a semiconductor process in FIG. 1, the present disclosure is not limited.

In FIG. 1, an organic light emitting display (OLED) device 100 according to a first embodiment of the present disclosure includes a wafer substrate 110, first electrodes 121, an organic light emitting layer 130, a second electrode 140 and an encapsulation layer 180.

The wafer substrate 110 may be a silicon wafer substrate formed using a semiconductor process. The wafer substrate 110 may include a gate line, a data line and a transistor. The gate line and the data line may be disposed to cross each other. The gate line may be connected to a gate driving unit to receive a gate signal. The data line may be connected to a data driving unit to receive a data signal.

A region where the first electrodes 121, the organic light emitting layer 130 and the second electrode 140 are sequentially formed may be defined as a pixel or sub-pixel. Hereinafter, what is referred to as "pixel" or "pixels" can also be interpreted as "sub-pixel" or "sub-pixels". For example, the first electrodes 121 are spaced apart from each other by a gap distance equal to or smaller than about 0.7 µm. Since the first electrodes 121 are spaced apart from each other on the wafer substrate 110, the pixel may be divided by the first electrodes 121. N transistors (N is a positive integer) may be disposed in the pixel, and a voltage is supplied to the first electrode 121 according to the data signal of the data line when the gate signal of the gate line is applied to the N transistors.

The organic light emitting layer 130 may be formed to cover the wafer substrate 110 and the first electrode 121. The organic light emitting layer 130 may be a common layer formed over the whole pixels commonly.

The second electrode 140 may be formed to cover the organic light emitting layer 130. The second electrode 140 may be a common layer formed over the whole pixels commonly.

The encapsulation layer 180 may be formed to cover the second electrode 140. The encapsulation layer 180 may function to prevent penetration of an oxygen and a moisture to the organic light emitting layer 130 and the second electrode 140.

Figure 2:
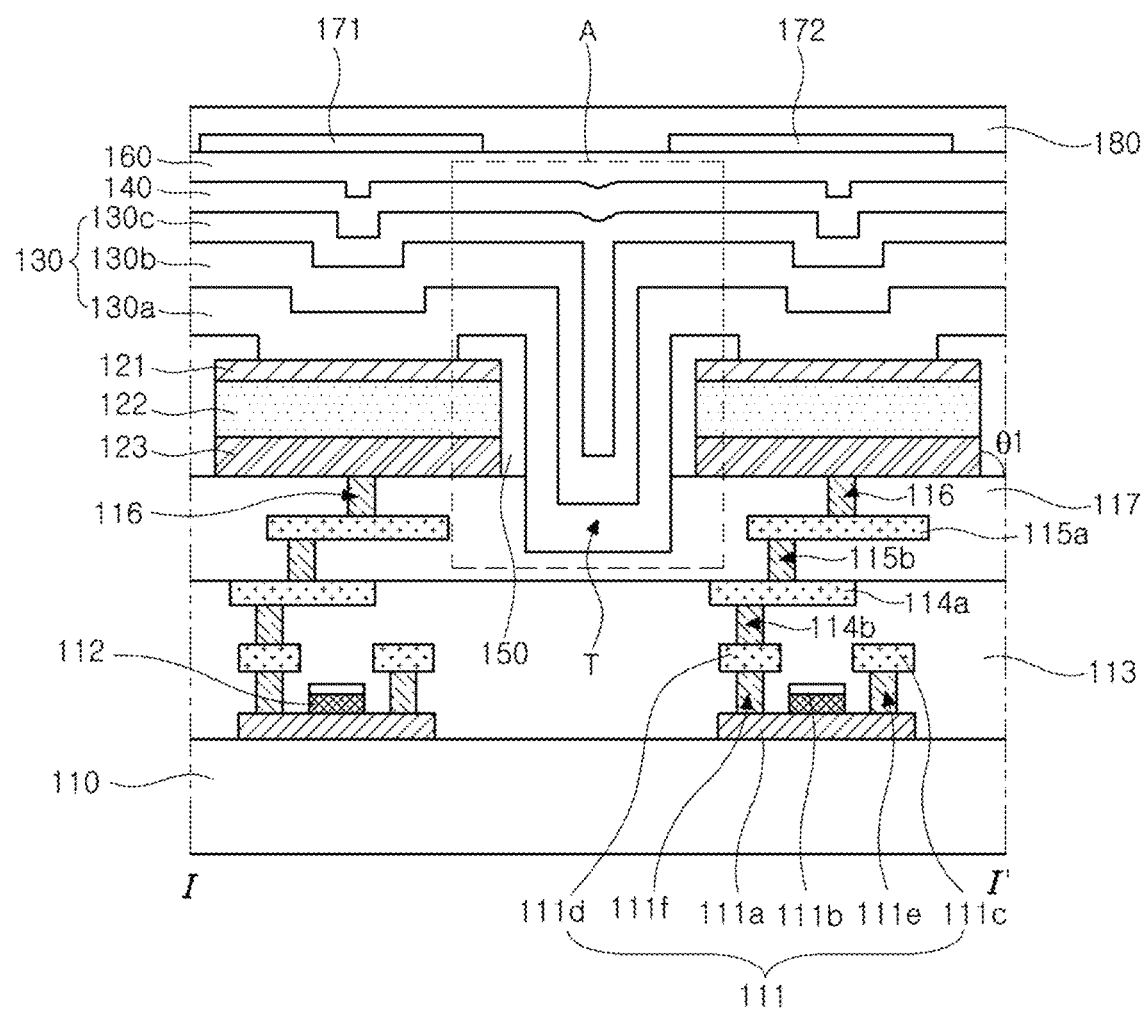
FIG. 2 is an example cross-sectional view taken along a line I-I' of FIG. 1.
Figure 3A:
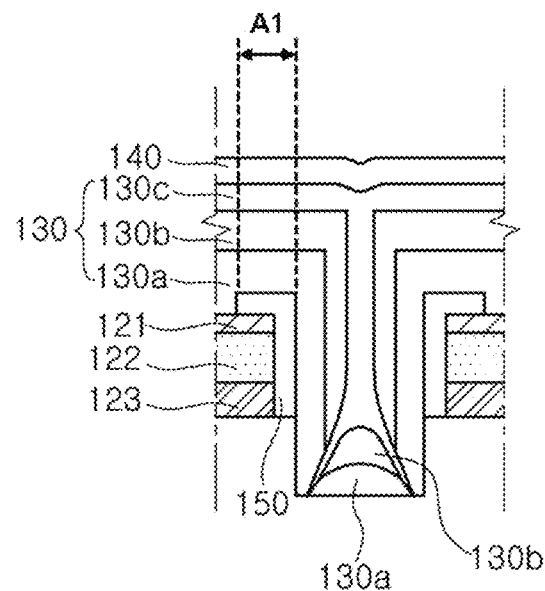
FIGS. 3A and 3B are magnified views of a portion A of FIG. 2 according to different embodiments of the present disclosure.
Figure 3B:
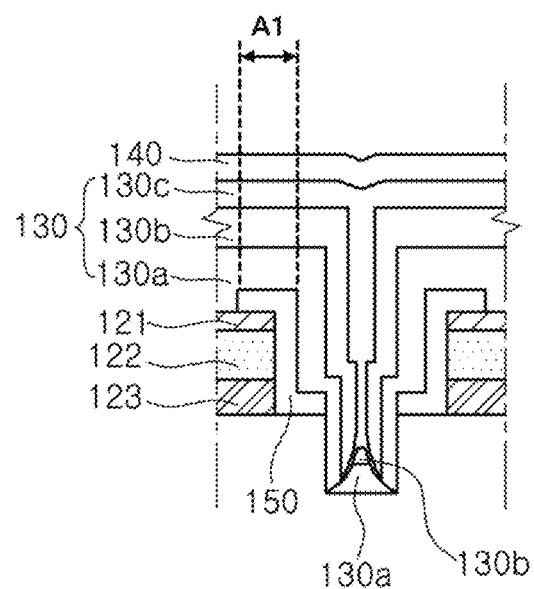

FIG. 2 is an example cross-sectional view taken along a line I-I' of FIG. 1, and FIGS. 3A and 3B are magnified views of a portion A of FIG. 2 according to different embodiments of the present disclosure. For purposes of simplicity, FIG. 2 (and FIGS. 5H, 6, and 7D) depict the organic light emitting layer 130 in the trench T as being continuous. However, in embodiments of the present disclosure, at least one of the layers 130a and/or 130b in the organic light emitting layer 130 in the trench T is discontinuous, as shown in the magnified views of FIGS. 3A and 3B, respectively.

In FIGS. 2, 3A and 3B, the transistors 111 are formed on the wafer substrate 110. Each of the transistors 111 includes an active layer 111a, a gate electrode 111b, a source electrode 111c and a drain electrode 111d. Although each of the transistors 111 has a top gate type where the gate electrode 111b is formed on the active layer 111a in FIG. 2, the embodiment is not limited to FIG. 2. Each of the transistors 111 may have a bottom gate type where the gate electrode 111b is formed under the active layer 111a or a double gate type where the gate electrode 111b is formed on and under the active layer 111a.

The active layer 111a is formed on the wafer substrate 110. The active layer 111a may include a semiconductor material of a silicon group or a semiconductor material of an oxide group. A gate insulating layer 112 is formed on the active layer 111a. The gate insulating layer 112 may have a single-layered structure or a multiple-layered structure of an inorganic material such as silicon oxide (SiOx) and silicon nitride (SiNx). The gate electrode 111b is formed on the gate insulating layer 112.

The source electrode 111c is connected to the active layer 111a through a first trench 111e, and the drain electrode 111d is connected to the active layer 111a through a second trench 111f. The active layer 111a, the gate electrode 111b, the source electrode 111c and the drain electrode 111d are insulated from each other by a first insulating layer 113. The first insulating layer 113 may have a single-layered structure or a multiple-layered structure of an inorganic material such as silicon oxide (SiOx) and silicon nitride (SiNx).

A first metal layer 114a and a second metal layer 115a are formed on the first insulating layer 113. The first metal layer 114a is connected to the drain electrode 111d through a third trench 114b, and the second metal layer 115a is connected to the first metal layer 114a through a fourth trench 115b. The first and second metal layers 114a and 115a are insulated by a second insulating layer 117. The second insulating layer 117 may have a single-layered structure or a multiple-layered structure of an inorganic material such as silicon oxide (SiOx) and silicon nitride (SiNx). The first metal layer 114a, the second metal layer 115a and the second insulating layer 117 may be omitted.

First electrodes 121 are formed on the second insulating layer 117. Each of the first electrodes 121 is connected to the second metal layer 115a through a fifth trench 116. The first electrodes 121 may include a transparent conductive oxide (TCO) such as indium tin oxide (ITO) and indium zinc oxide (IZO).

The OLED device 100 exemplarily has a top emission type where a light is emitted from the organic light emitting layer 130 to an upper portion. A reflecting electrode 122 may be disposed under each of the first electrodes 121 to reflect a light emitted from the organic light emitting layer 130 to a lower portion. The reflecting electrode 122 may include a metallic material having a relatively high reflectance such as silver (Ag).

A buffer electrode 123 may be disposed under the reflecting electrode 122. The buffer electrode 123 may have a double-layered structure of titanium (Ti) and titanium nitride (TiN). The buffer electrode 123 may be omitted.

The first electrodes 121, the reflecting electrode 122 and the buffer electrode 123 may have a vertical structure where a side surface of the first electrodes 121, the reflecting electrode 122 and the buffer electrode 123 has a first angle θ1 of about 90 degree with a top surface of the second insulating layer 117.

To planarize a step difference due to the first electrodes 121, the reflecting electrode 122 and the buffer electrode 123, a planarizing layer 150 may be formed between the first electrodes 121. The planarizing layer 150 may include a sixth trench T penetrating the planarizing layer 150 and the second insulating layer 117 may be partially removed to correspond to the sixth trench T. The planarizing layer 150 may cover an edge portion of the first electrode 121 in a first region A1 to prevent a shortage between the first electrode 121 and the organic light emitting layer 130 and may be formed on the second insulating layer 117 in a third region A3 to adjust a width of the sixth trench T.

The organic light emitting layer 130 is formed on the first electrodes 121 and the planarizing layer 150. The organic light emitting layer 130 may include at least one of a hole injecting layer (HIL), a hole transporting layer (HTL), emitting material layer (EML), an electron transporting layer (ETL) and an electron injecting layer (EIL). When voltages are applied to the first electrode 121 and the second electrode 140, a hole moves to the emitting material layer through the HIL and the HTL and an electron moves to the emitting material layer through the EIL and the ETL. The hole and the electron are combined with each other to emit a light.

The organic light emitting layer 130 may be a white emitting layer to emit a white-colored light. The organic light emitting layer 130 may be a common layer formed over the whole pixels commonly.

The organic light emitting layer 130 may have a tandem structure including at least two stacks. For example, the organic light emitting layer 130 may include a first stack 130a, a charge generating layer 130b and a second stack 130c. Each of the at least two stacks may include a hole transporting layer, at least one emitting material layer and an electron transporting layer. For example, a first stack may be formed on a first electrode, a charge generating layer may be formed on the first stack, and a second stack may be formed on the charge generating layer. In addition, a second charge generating layer may be formed on the second stack, and an additional stack may be formed on the second charge generating layer.

The charge generating layer may be formed between the stacks. The charge generating layer may include an N type charge generating layer adjacent to a lower stack and a P type charge generating layer over the N type charge generating layer adjacent to an upper stack. The N type charge generating layer injects an electron to the lower stack, and the P type charge generating layer injects a hole to the upper stack. The N type charge generating layer may include an organic layer doped with an alkali metal such as lithium (Li), sodium (Na), potassium (K) and cesium (Cs) or an alkaline earth metal such as magnesium (Mg), strontium (Sr), barium (B a) and radium (Ra). The P type charge generating layer may include an organic material having a hole transporting ability doped with a dopant.

The organic light emitting layer 130 may be formed through a deposition process or a soluble process. For example, the organic light emitting layer 130 may be formed through an evaporation method of the deposition process. The film formed through an evaporation method may have a poor step coverage property. When the planarizing layer 150 is not disposed between the first electrodes 121, the organic light emitting layer 130 may have a relatively small thickness at a step difference region over the first electrode 121 (i.e., a top edge region of the first electrode 121). Since a distance between the step difference region of the first electrodes 121 and the second electrode 140 is reduced, a strong electric field is generated between the first and second electrodes 121 and 140 at the step difference region. As a result, abnormal emission or deterioration of the organic light emitting layer 130 may be accelerated and a shortage between the first electrodes 121 and the charge generating layer of the organic light emitting layer 130 or between the first electrodes and the second electrode 140 may occur due to the strong electric field and electrons concentrated on the step difference region of the first electrode 121. A step coverage means a capability of a film to cover a step difference without a cut.

In the first embodiment of the present disclosure, since the planarizing layer 150 filling the step difference of the second insulating layer 117 and the first electrode 121 and covering the step difference region of the first electrodes 121 is formed between the first electrodes 121, the step difference of the first electrode 121 may be mitigated. As a result, abnormal emission or deterioration of the organic light emitting layer 130 may be prevented and a shortage between the first electrodes 121 and the charge generating layer of the organic light emitting layer 130 or between the first electrodes 121 and the second electrode 140 in the step difference region between the second insulating layer 117 and the first electrode 121 and over the first electrode 121 may be prevented. Since the planarizing layer 150 is formed to cover the edge portion of the first electrode 121 in the first region A1, a shortage between the first electrode 121 and the organic light emitting layer 130 may be prevented. The planarizing layer 150 covering the edge portion of the first electrode 121 may define an emitting region of a corresponding pixel. The planarizing layer 150 covering the edge portion of the first electrode 121 may prevent injection of charge from the first electrode 121 to a portion of the organic light emitting layer 130 covering the planarizing layer such that it does not emit light. The planarizing layer 150 contacting the edge portion of the first electrode 121 in the first region A1 may have a width equal to or greater than about 0.1 µm. Specifically, as in FIG. 3B, a width of the sixth trench T of the planarizing layer 150 may be adjusted by forming the planarizing layer 150 on the second insulating layer 117 in the third region A3.

Since the organic light emitting layer 130 has a poor step coverage property, a thickness of the organic light emitting layer 130 on a sidewall of the sixth trench T may be smaller than a thickness on a bottom surface of the sixth trench T as in FIGS. 3A and 3B. The sixth trench T may be divided into two parts in the planarizing layer 150 and the second insulating layer 117. At least one of the first stack 130a and the charge generating layer 130b of the organic light emitting layer 130 may be formed to have a cut portion (e.g., discontinuous portion) at a position where the sidewall surface and the bottom surface of the sixth trench T meet to increase a resistance of the organic light emitting layer 130. As a result, an influence on an adjacent pixel due to a leakage current through the organic light emitting layer 130 may be minimized. For example, transmission of the leakage current may be effectively prevented by the cut portion of the charge generating layer.

In the first embodiment of the present disclosure, since the sixth trench T is formed in the planarizing layer 150 and the second insulating layer 117, a path of the leakage current through the organic light emitting layer 130 between the adjacent pixels may be elongated as compared with an OLED device without the sixth trench T. In addition, since the thickness of the organic light emitting layer 130 on the sidewall surface of the sixth trench T is smaller than the thickness of the organic light emitting layer 130 on the bottom surface of the sixth trench T, the resistance of the organic light emitting layer 130 may increase and an influence on the adjacent pixel due to a leakage current through the organic light emitting layer 130 may be minimized. For example, the sixth trench T may have a width equal to or smaller than about 0.17 μm and a depth equal to or greater than about 0.5 μm.

The second electrode 140 is disposed on the organic light emitting layer 130. The second electrode 140 may be a common layer formed over the whole pixels commonly. The second electrode 140 may include a transparent conductive material such as indium tin oxide (ITO) and indium zinc oxide (IZO) or a semi-transmissive conductive material such as magnesium (Mg), silver (Ag) and alloy of magnesium and silver.

When the second electrode 140 includes a semi-transmissive conductive material, a micro cavity effect may be obtained. The second electrode 140 may be formed through a physical vapor deposition (PVD) method such as a sputtering. Since a film formed through a PVD method has an excellent step coverage, the second electrode 140 may have a uniform thickness as compared with the organic light emitting layer 130 even with the sixth trench T.

A sealing layer 160 is formed on the second electrode 140. The sealing layer 160 may prevent penetration of an oxygen or a moisture to the organic light emitting layer 130 and the second electrode 140. For example, the sealing layer 160 may include at least one inorganic layer and at least one organic layer.

Color filters 171 and 172 are disposed on the sealing layer 160 to correspond to the pixels P. For example, a red color filter may be disposed to correspond to a red pixel, a green color filter may be disposed to correspond to a green pixel, and a blue color filter may be disposed to correspond to a blue pixel.

An overcoat layer may be formed on the color filters 171 and 172 to planarize a step difference due to the color filters 171 and 172. An encapsulation film 180 may be formed on the color filters 171 and 172.

Figure 4:
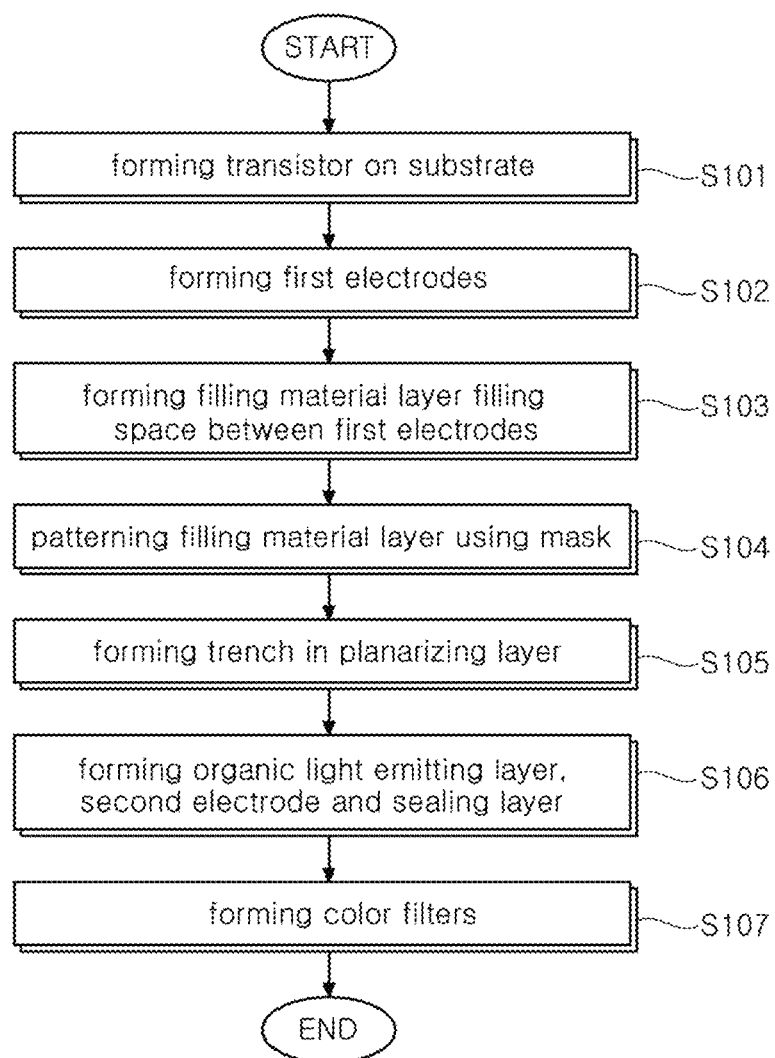
FIG. 4 is a flow chart showing a method of fabricating an organic light emitting display device according to a first embodiment of the present disclosure.
Figure 5A:
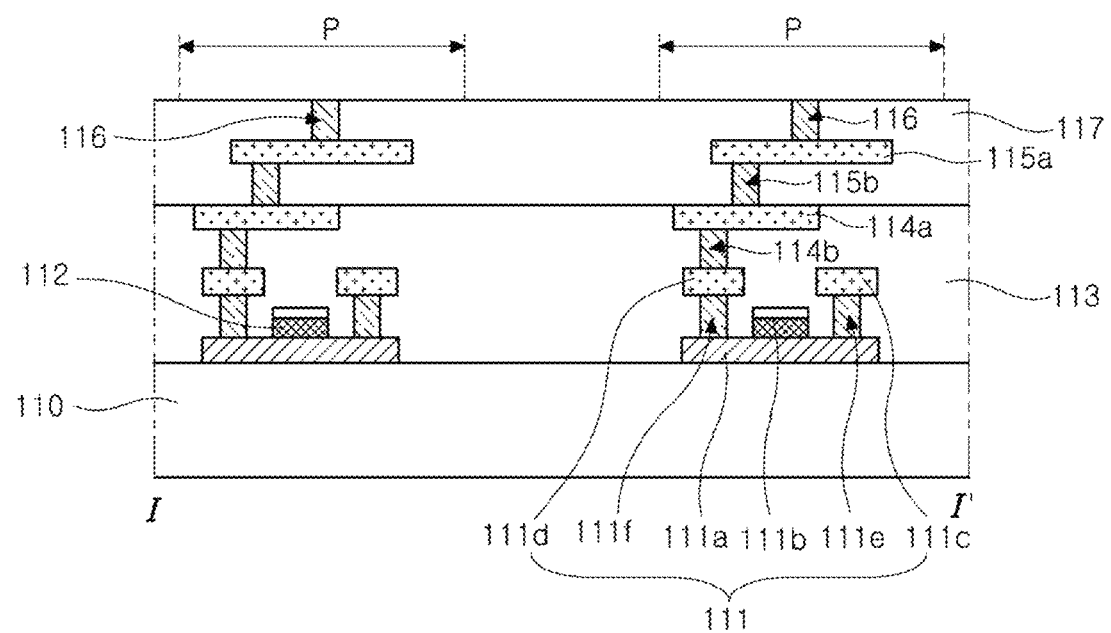
FIGS. 5A, 5B, 5C, 5D, 5E, 5F, 5G and 5H are cross-sectional views showing a method of fabricating an organic light emitting display device according to a first embodiment of the present disclosure.
Figure 5B:
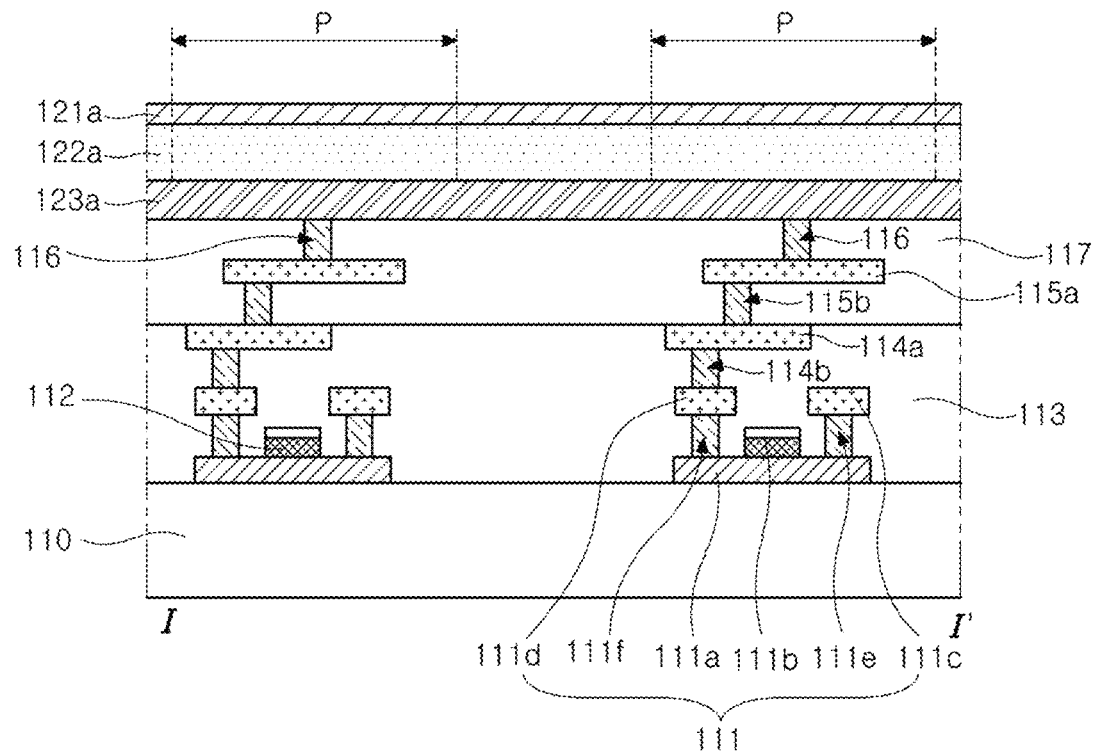
Figure 5C:
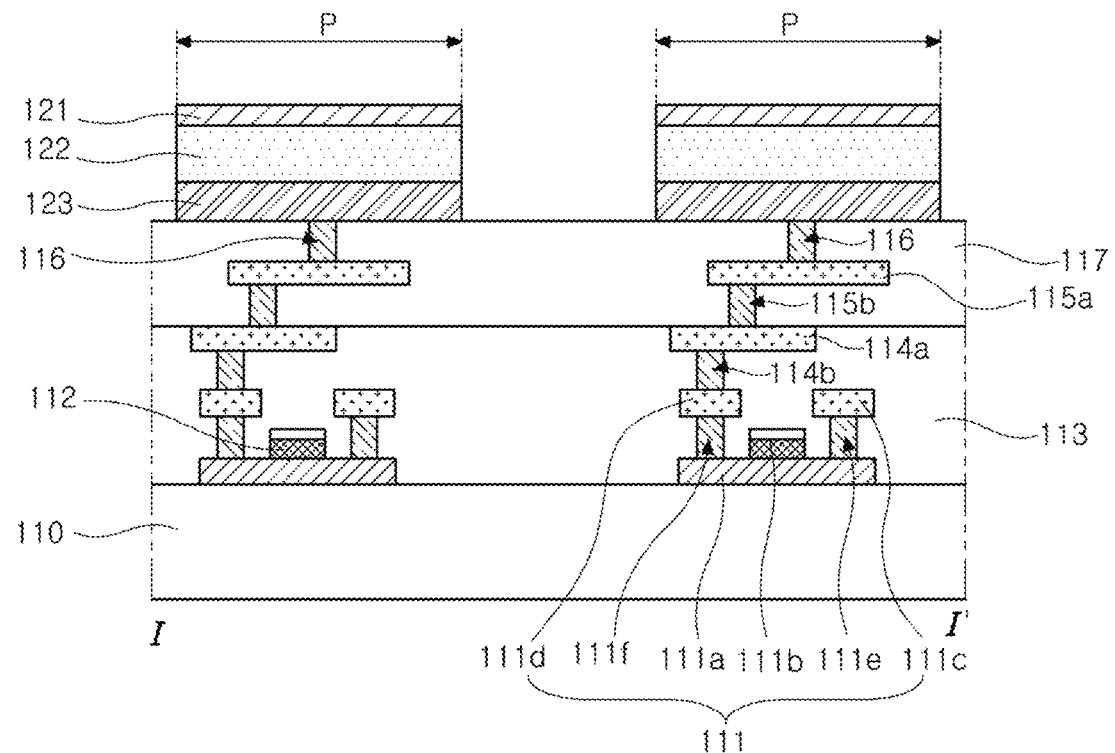
Figure 5D:
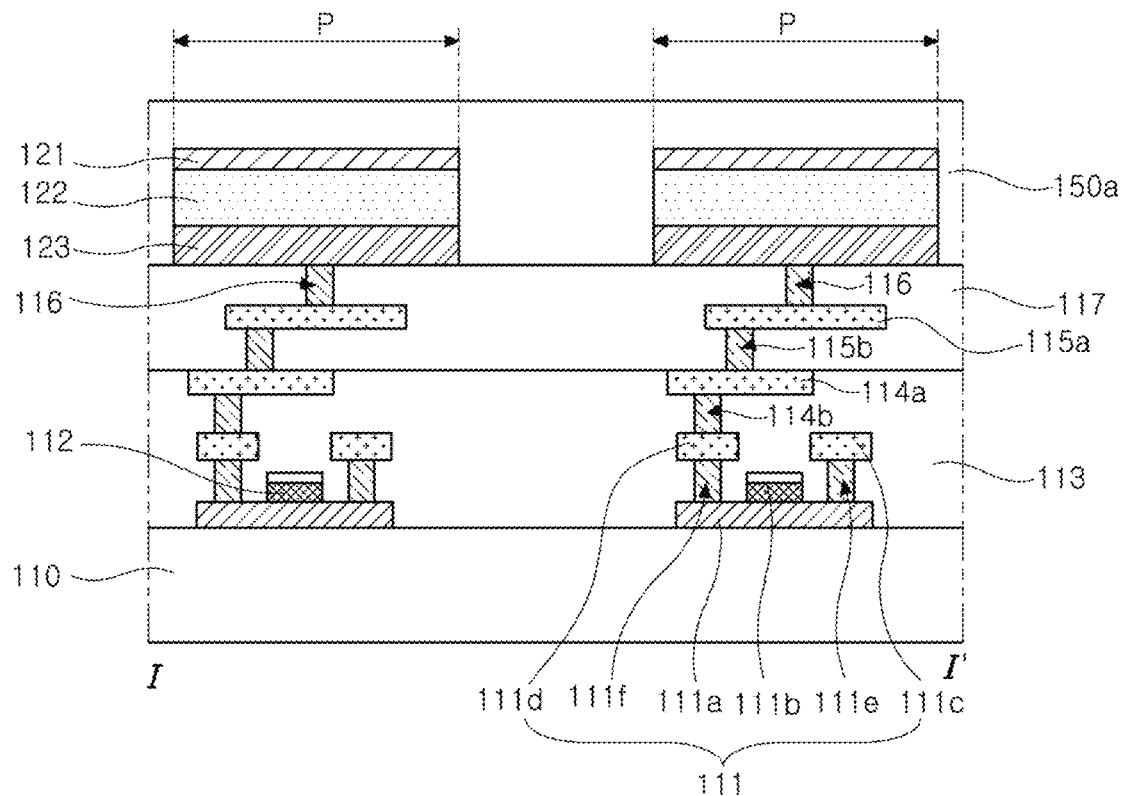
Figure 5E:
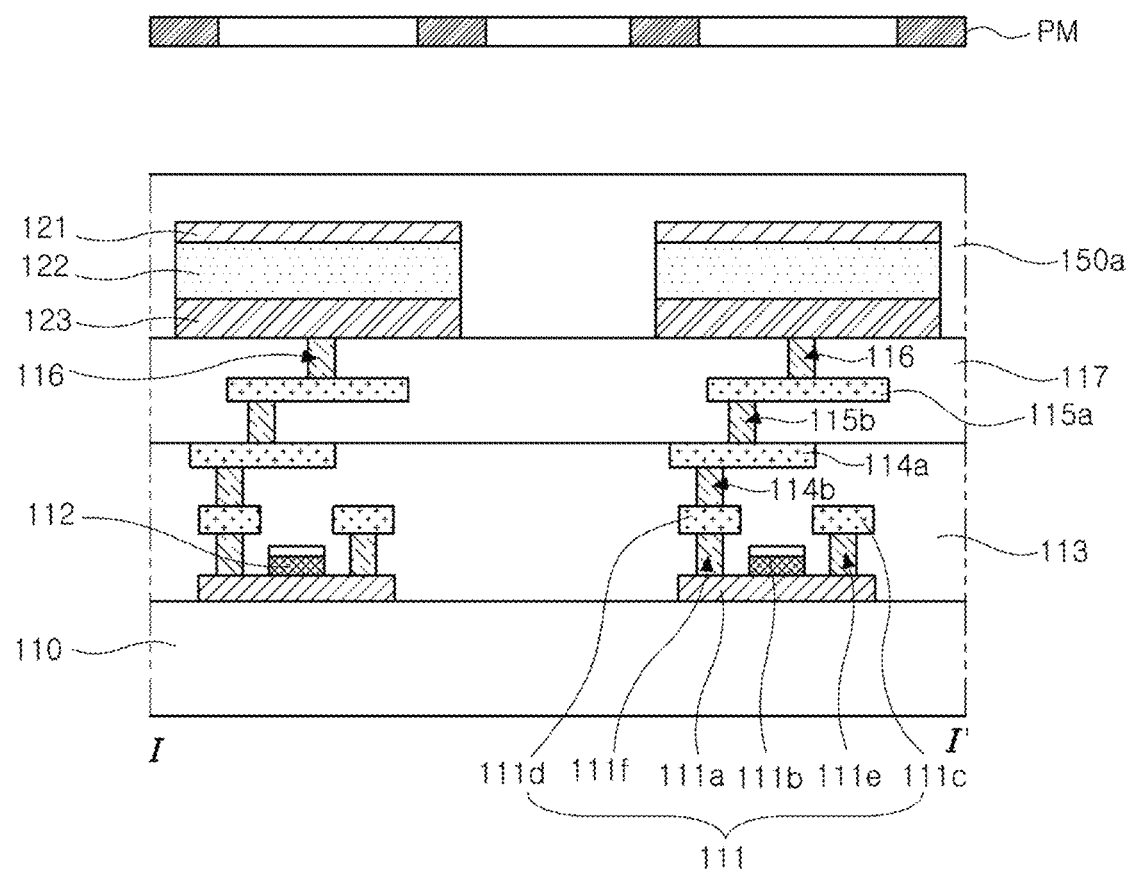
Figure 5F:
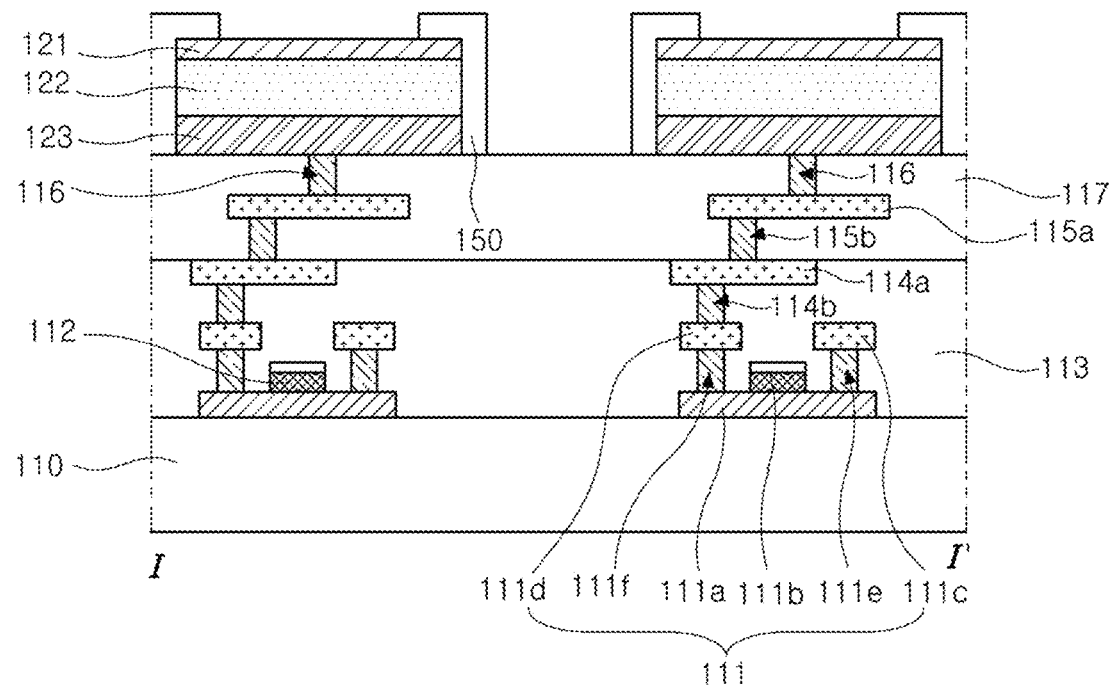
Figure 5G:
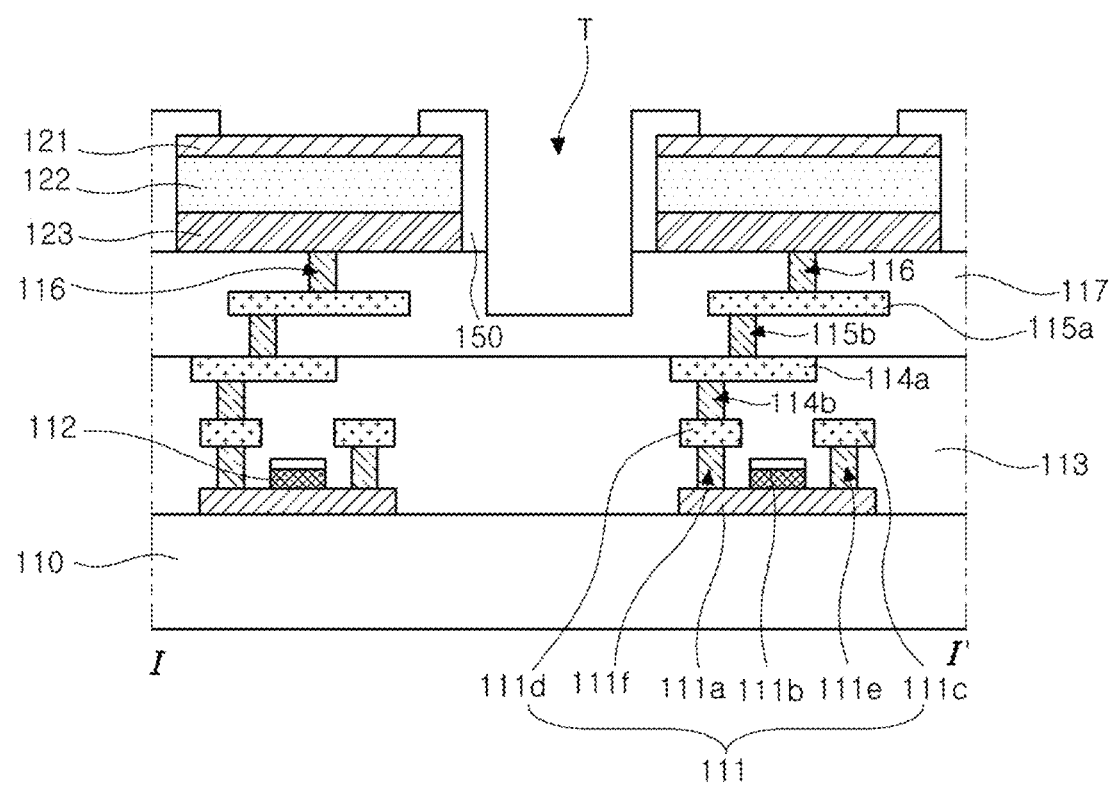
Figure 5H:
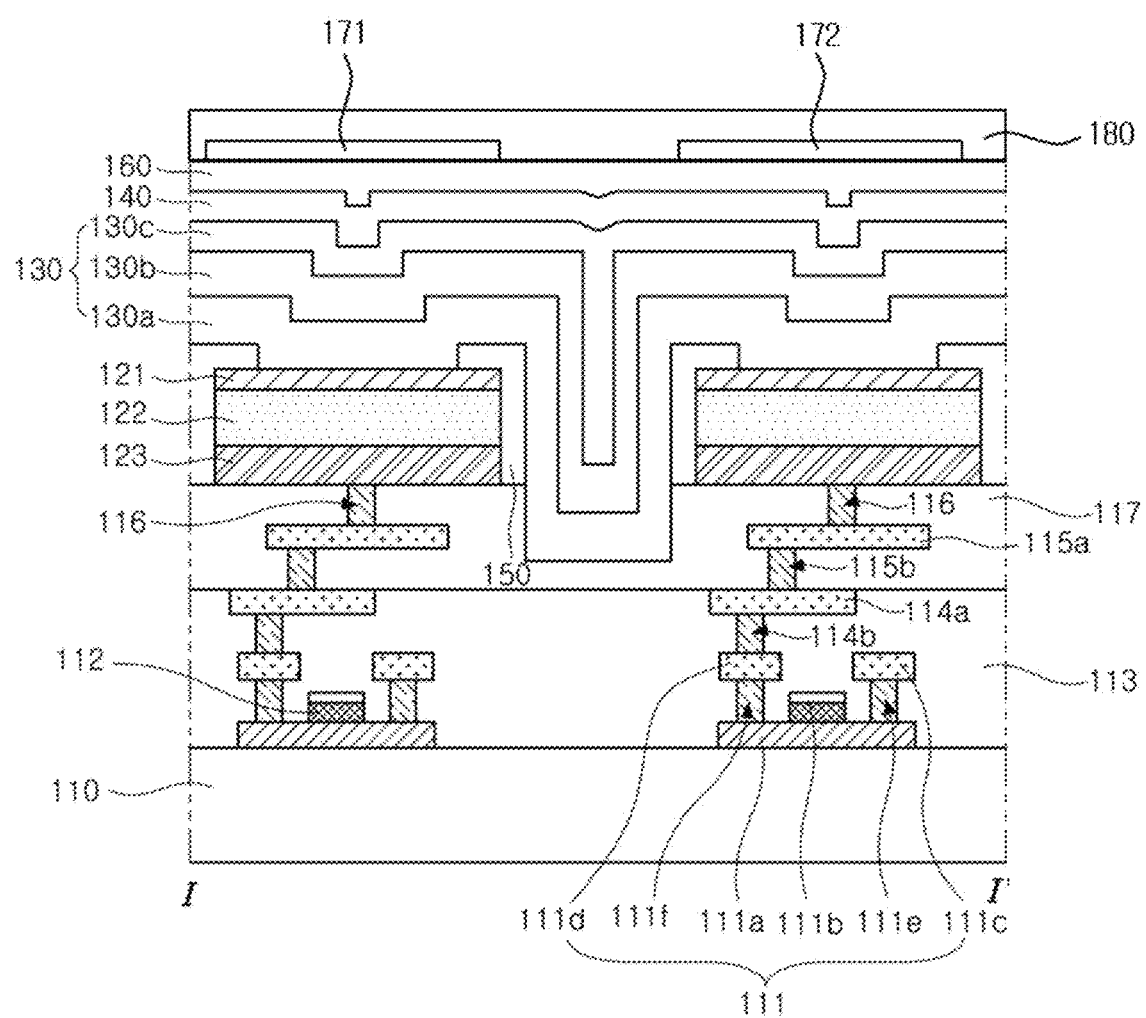
Figure 6:
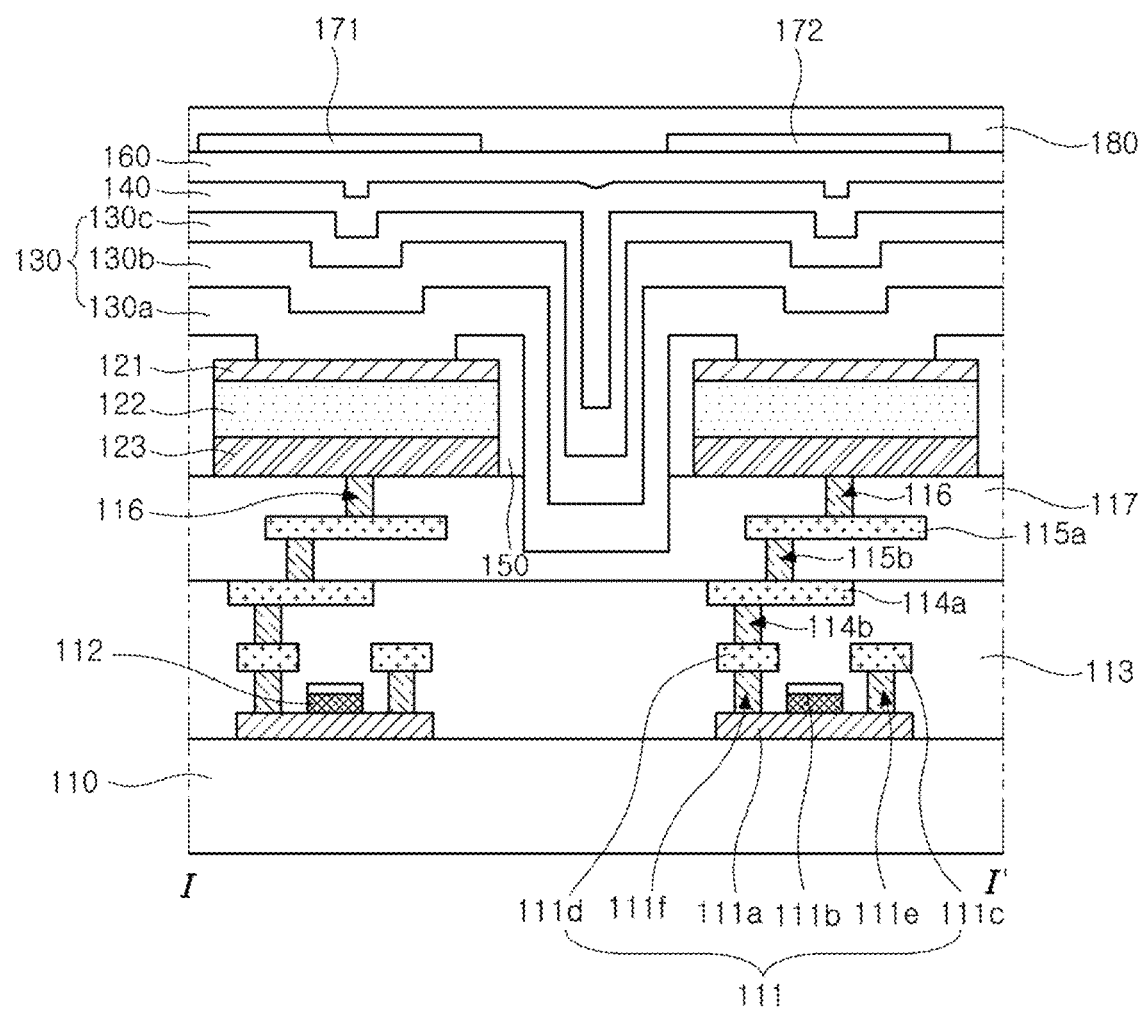
FIG. 6 is a cross-sectional view showing an organic light emitting display device according to another embodiment of the present disclosure.

FIG. 4 is a flow chart showing a method of fabricating an organic light emitting display device according to a first embodiment of the present disclosure, FIGS. 5A to 5H are cross-sectional views showing a method of fabricating an organic light emitting display device according to a first embodiment of the present disclosure, and FIG. 6 is a cross-sectional view showing an organic light emitting display device according to another embodiment of the present disclosure. FIGS. 5A to 5H correspond to a line I-I' of FIG. 1, and FIG. 6 corresponds to FIG. 5H. For purposes of simplicity, FIGS. 5H and 6 depict the organic light emitting layer 130 in the trench T as being continuous. However, in embodiments of the present disclosure, at least one of the layers 130a and/or 130b in the organic light emitting layer 130 in the trench T is discontinuous, as shown in the magnified views of FIGS. 3A and 3B, respectively.

In FIGS. 4 and 5A, the transistors 111 are formed on the wafer substrate 110 (S101). The active layer 111a of each of the transistors 111 is formed on the wafer substrate 110. The active layer 111a may include a semiconductor material of a silicon group or a semiconductor material of an oxide group.

The gate insulating layer 112 is formed on the active layer 111a. The gate insulating layer 112 may include a single-layered structure or a multiple-layered structure of an inorganic material such as silicon oxide (SiOx) and silicon nitride (SiNx).

The gate electrode 111b is formed on the gate insulating layer 112. The first insulating layer 113 is formed on the active layer 111a and the gate electrode 111b. The first insulating layer 113 may include a single-layered structure or a multiple-layered structure of an inorganic material such as silicon oxide (SiOx) and silicon nitride (SiNx).

The first and second trenches 111e and 111f exposing the active layer 111a are formed in the first insulating layer 113. The source electrode 111c and the drain electrode 111d are formed on the first insulating layer 113. The source electrode 111c is connected to the active layer 111a through the first trench 111e, and the drain electrode 111d is connected to the active layer 111a through the second trench 111f.

The first insulating layer 113 is further formed on the source electrode 111c and the drain electrode 111d. The third trench 114b exposing the drain electrode 111d is formed in the first insulating layer 113. The first metal layer 114a is formed on the first insulating layer 113. The first metal layer 114a is connected to the drain electrode 111d through the third trench 114b.

The second insulating layer 117 is formed on the first metal layer 114a. The second insulating layer 117 may include a single-layered structure or a multiple-layered structure of an inorganic material such as silicon oxide (SiOx) and silicon nitride (SiNx).

The fourth trench 115b exposing the first metal layer 114a is formed in the second insulating layer 117. The second metal layer 115a is formed on the second insulating layer 117. The second metal layer 115a is connected to the first metal layer 114a through the fourth trench 115b.

The second insulating layer 117 is further formed on the second metal layer 115a. The fifth trench 116 exposing the second metal layer 115a is formed in the second insulating layer 117.

In FIGS. 4 and 5B, the first electrodes 121 are formed on the second insulating layer 117 (S102). The buffer metal layer 123a, the reflecting metal layer 122a and a first metal layer 121a are sequentially formed on the second insulating layer 117. The buffer metal layer 123a may have a double-layered structure of titanium (Ti) and titanium nitride (TiN). The reflecting metal layer 122a may include a metallic material having a relatively high reflectance such as silver (Ag). The first metal layer 121a may include a transparent conductive oxide (TCO) such as indium tin oxide (ITO) and indium zinc oxide (IZO).

A photoresist pattern is formed on the first metal layer 121a, the reflecting metal layer 122a and the buffer metal layer 123a. The photoresist pattern may be disposed in the pixels P.

In FIGS. 4 and 5C, the first electrodes 121, the reflecting electrodes 122 and the buffer electrodes 123 are formed by dry-etching the first metal layer 121a, the reflecting metal layer 122a and the buffer metal layer 123a outside the photoresist pattern. Next, the photoresist pattern is removed.

In FIGS. 4 and 5D, the planarizing layer 150 is formed on the first electrodes 121 (S103). The planarizing layer 150 fills a space between the first electrodes 121. A filling material layer 150a is formed on the second insulating layer 117 and the first electrode 121. For example, the filling material layer 150a may include one of acrylic resin, epoxy resin, phenolic resin, polyamide resin and polyimide resin.

In FIGS. 4 and 5E, the filling material layer 150a is patterned through a photolithographic process using a photo mask PM to form the planarizing layer 150. A step of forming a photoresist layer and a step of forming a photoresist pattern corresponding to a mask pattern are omitted in FIG. 5E.

In FIGS. 4 and 5F, the filling material layer 150a may be patterned through a direct exposure and a direct etching without the photoresist pattern according to a material property of the filling material layer 150a. An etching material which can etch the filling material layer 150a and cannot etch the first electrodes 121 may be selected for the step of etching the filling material layer 150a. The planarizing layer 150 may include a second region A2 covering a side surface of the first electrodes 121. The planarizing layer 150 may further include at least one of a first region A1 covering an edge top surface of the first electrodes 121 and a third region A3 covering the second insulating layer 117. The third region A3 may have a width greater than the second region A2. The planarizing layer 150 may be spaced apart from each other by the sixth trench T (S104).

In FIGS. 4 and 5G, the second insulating layer 117 is etched using the planarizing layer 150 as an etching mask. Since an additional mask is not required, a fabrication process is simplified. In addition, since the fabrication deviation is reduced, the defective proportion is reduced and the fabrication cost is reduced. An etching material which can etch the second insulating layer 117 and cannot etch the planarizing layer 150 and the first electrodes 121 may be selected. For example, an etching solution for the second insulating layer 117 may be different from an etching solution for the filling material layer 150a or the photoresist pattern of the filling material layer 150a. The sixth trench T is formed in the second insulating layer 117 using the planarizing layer 150 as an etching mask. The etching step for the second insulating layer 117 may be combined with the etching step for the filling material layer 150a, and an etching material which can etch the second insulating layer 117 and the planarizing layer 150 and cannot etch the first electrode 121 may be used for the combined step. The etching material may have different etch rates for the second insulating layer 117 and the planarizing layer 150 and have a relatively high etch rate for the second insulating layer 117. Since the sixth trench T is formed using the planarizing layer 150 as an etching mask, a lower edge of the planarizing layer 150 may coincide with an upper edge of the sixth trench T in the second insulating layer 117. The planarizing layer 150 and the second insulating layer 117 may include the sixth trench T commonly (S105).

In FIGS. 4 and 5H, the organic light emitting layer 130, the second electrode 140 and the sealing layer 160 are sequentially formed on the planarizing layer 150 having the sixth trench T (S106).

The organic light emitting layer 130 is formed on the first electrodes 121 and the planarizing layer 150. The organic light emitting layer 130 may be formed through a deposition process or a soluble process. When the organic light emitting layer 130 is formed through a deposition process, the organic light emitting layer 130 may be formed using an evaporation method.

The organic light emitting layer 130 may be a white emitting layer to emit a white-colored light. The organic light emitting layer 130 may be a common layer formed over the whole pixels commonly.

When the organic light emitting layer 130 is a white emitting layer, the organic light emitting layer 130 may have a tandem structure including at least two stacks. Each of the at least two stacks may include a hole transporting layer, at least one emitting material layer and an electron transporting layer.

The charge generating layer may be formed between the stacks. The charge generating layer may include an N type charge generating layer adjacent to a lower stack and a P type charge generating layer adjacent to an upper stack. The N type charge generating layer injects an electron to the lower stack, and the P type charge generating layer injects a hole to the upper stack. The N type charge generating layer may include an organic layer doped with an alkali metal such as lithium (Li), sodium (Na), potassium (K) and cesium (Cs) or an alkaline earth metal such as magnesium (Mg), strontium (Sr), barium (B a) and radium (Ra). The P type charge generating layer may include an organic material having a hole transporting ability doped with a dopant.

The organic light emitting layer 130 formed through an evaporation method may have a poor step coverage property. As a result, a thickness of the organic light emitting layer 130 on the sidewall surface of the sixth trench T may be smaller than a thickness of the organic light emitting layer 130 on the bottom surface of the sixth trench T. In addition, at least one of a stack and a charge generating layer of the organic light emitting layer 130 may be formed to have a cut portion at a position where the sidewall surface and the bottom surface of the sixth trench T meet to increase a resistance of the organic light emitting layer 130. As a result, an influence on an adjacent pixel due to a leakage current through the organic light emitting layer 130 may be minimized.

The second stack 130c of the organic light emitting layer 130 may planarize the unevenness of the charge generating layer 130b of the organic light emitting layer 130 corresponding to the sixth trench T to have a flat top surface in FIG. 5H. In FIG. 6, the second stack 130c of the organic light emitting layer 130 may not planarize the unevenness of the charge generating layer 130b of the organic light emitting layer 130 corresponding to the sixth trench T to have an uneven top surface.

The second electrode 140 is formed on the organic light emitting layer 130. The second electrode 140 may be a common layer formed over the whole pixels commonly. The second electrode 140 may include a transparent conductive oxide (TCO) such as indium tin oxide (ITO) and indium zinc oxide (IZO) or a semi-transmissive conductive material such as magnesium (Mg), silver (Ag) and alloy of magnesium and silver. When the second electrode 140 includes a semi-transmissive conductive material, a micro cavity effect may be obtained.

The second electrode 140 may be formed through a physical vapor deposition (PVD) method such as a sputtering. Since a film formed through a PVD method has an excellent step coverage, the second electrode 140 may have a uniform thickness as compared with the organic light emitting layer 130 even with the sixth trench T.

The sealing layer 160 is formed on the second electrode 140. The sealing layer 160 may prevent penetration of an oxygen or a moisture to the organic light emitting layer 130 and the second electrode 140. For example, the sealing layer 160 may include at least one inorganic layer and at least one organic layer.

The color filters 171 and 172 are formed on the sealing layer 160 (S107). The color filters 171 and 172 correspond to the pixels. For example, a red color filter may be disposed to correspond to a red pixel, a green color filter may be disposed to correspond to a green pixel, and a blue color filter may be disposed to correspond to a blue pixel. An overcoat layer may be formed on the color filters 171 and 172 to planarize a step difference due to the color filters 171 and 172. The encapsulation film 180 may be attached to the color filters 171 and 172.

Figure 7A:
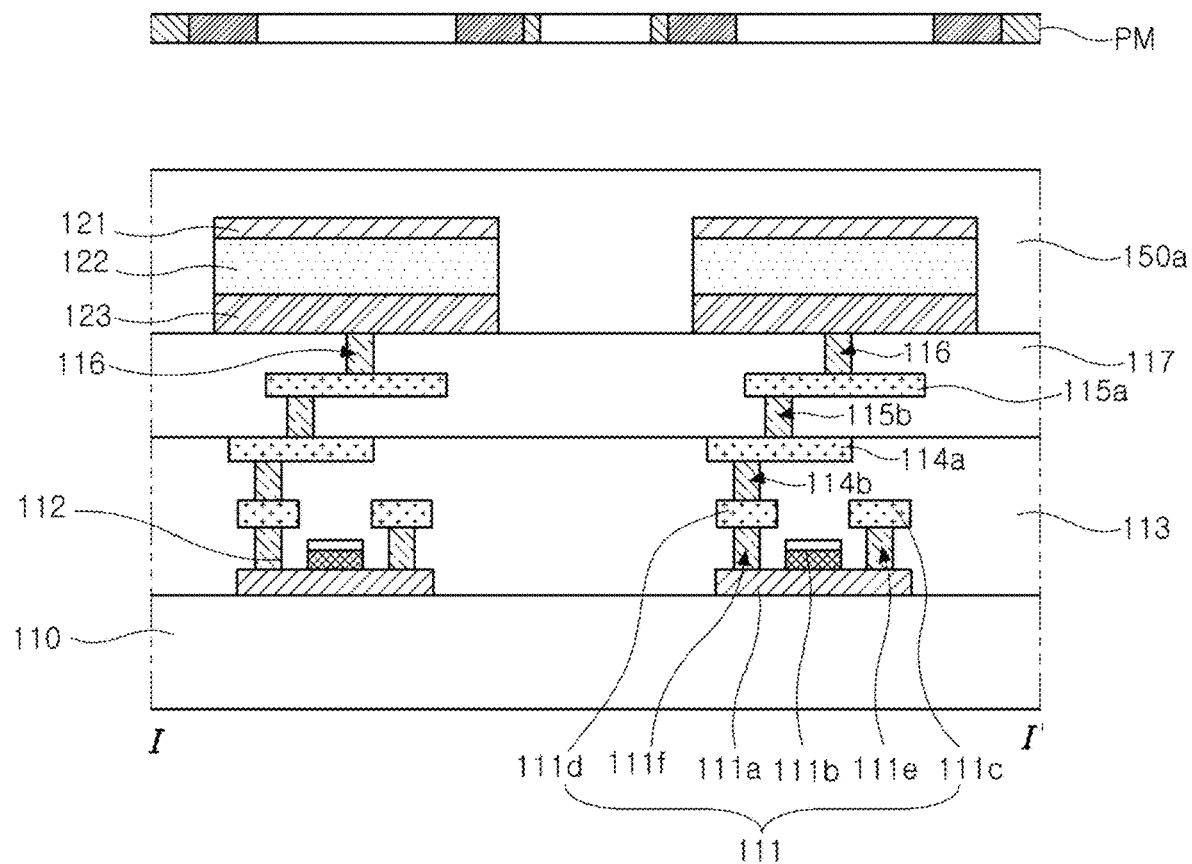
FIGS. 7A, 7B, 7C, and 7D are cross-sectional views showing a method of fabricating an organic light emitting display device according to a second embodiment of the present disclosure.
Figure 7B:
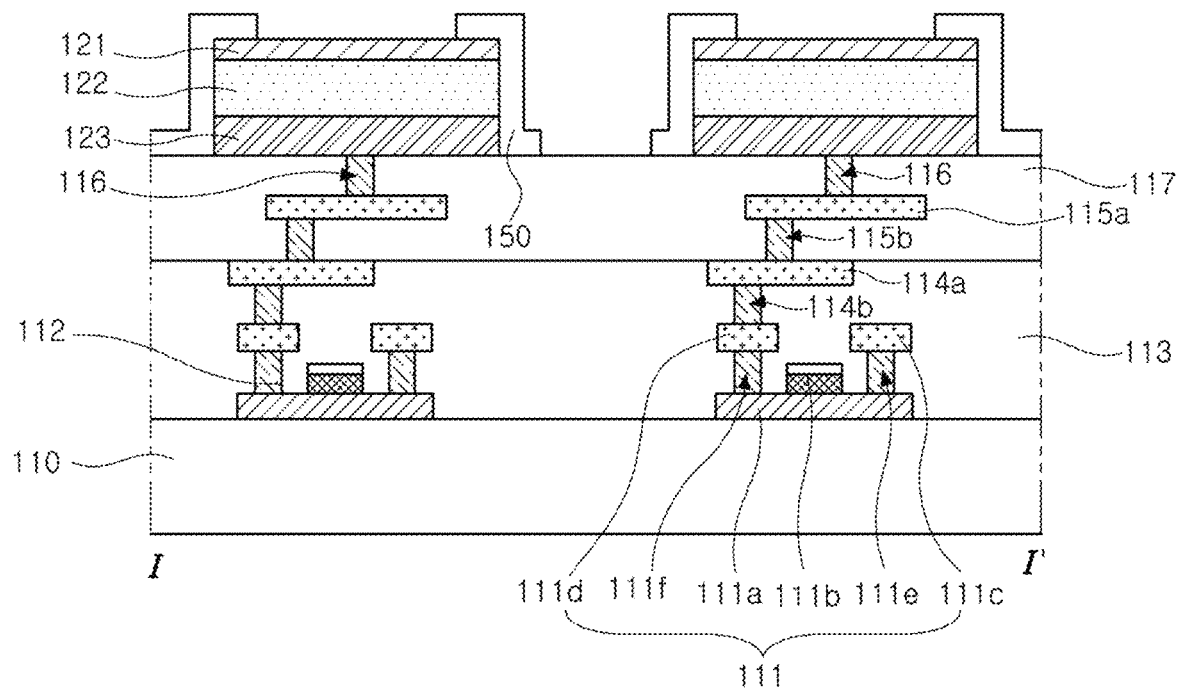
Figure 7C:
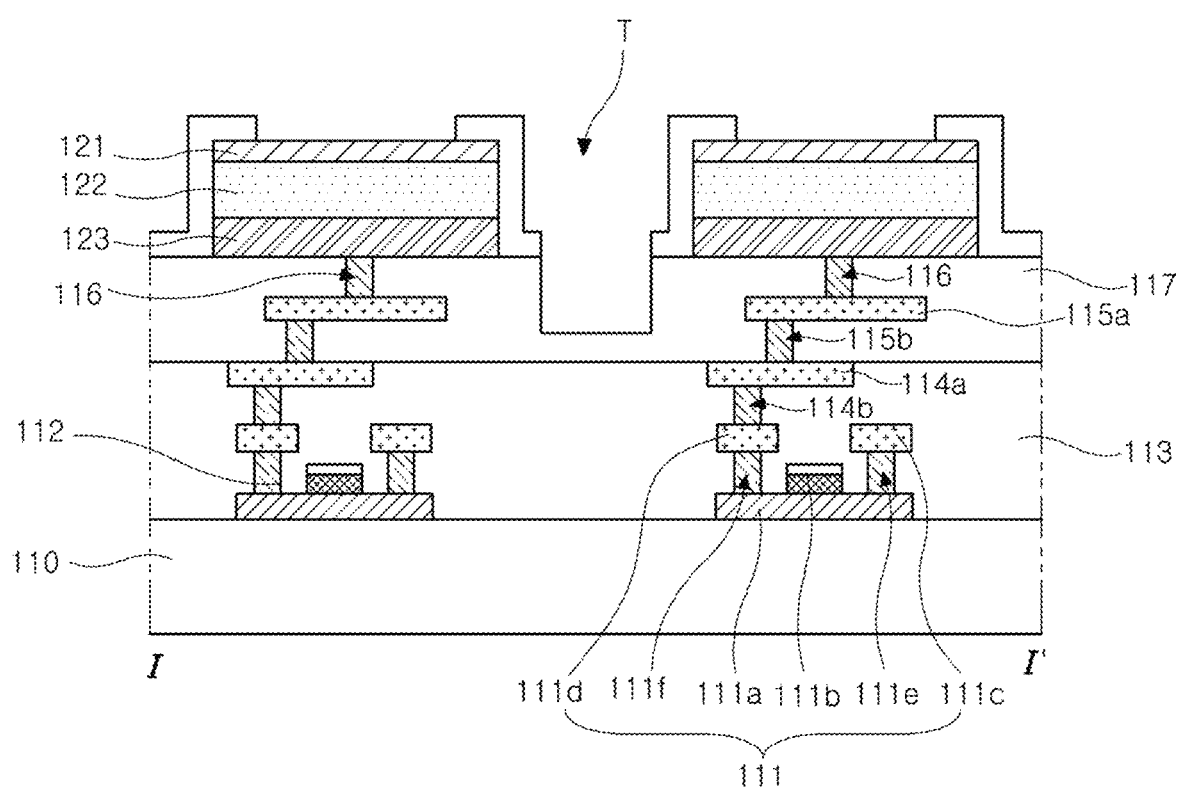
Figure 7D:
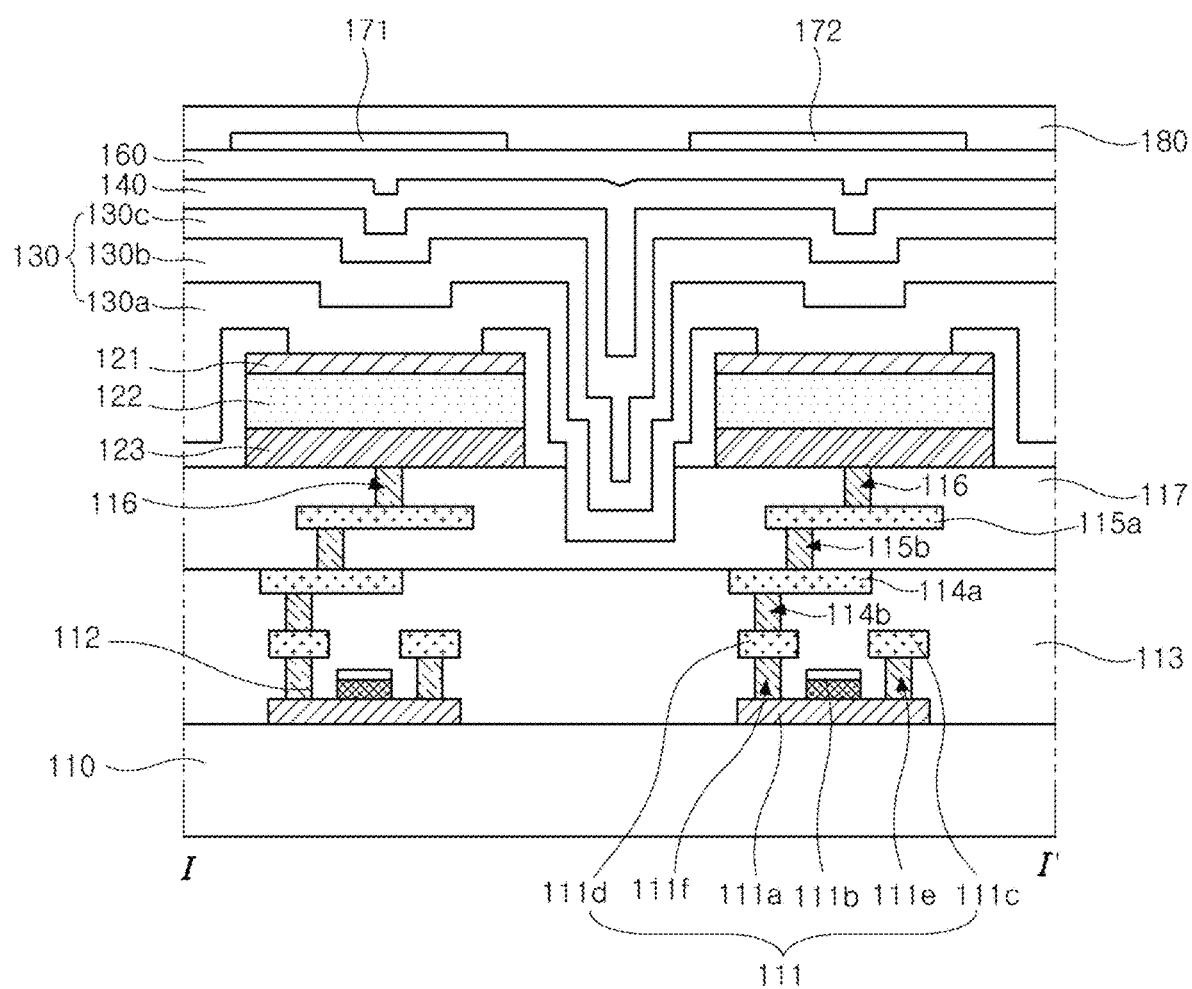

FIGS. 7A to 7D are cross-sectional views showing a method of fabricating an organic light emitting display device according to a second embodiment of the present disclosure. FIGS. 7A to 7D correspond to a line I-F of FIG. 1. For purposes of simplicity, FIG. 7D depicts the organic light emitting layer 130 in the trench T as being continuous. However, in embodiments of the present disclosure, at least one of the layers 130a and/or 130b in the organic light emitting layer 130 in the trench T is discontinuous, as shown in the magnified views of FIGS. 3A and 3B, respectively.

Steps of forming the transistors 111, the first and second metal layers 114a and 115a, the first electrodes 121 and the filling material layer 150a of the second embodiment are the same as the steps of FIGS. 5A to 5D of the first embodiment.

In FIG. 7A, the filling material layer 150a is patterned through a photolithographic process using a photo mask PM including three transmittances to form a tail shape at a contact portion of the planarizing layer 150 and the second insulating layer 117. The planarizing layer 150 may include the first region A1 covering the edge top surface of the first electrodes 121, the second region A2 covering the side surface of the first electrodes 121 and the third region A3 contacting the second insulating layer 117 and connected to the second region A2. The width of the third region A3 may be greater than the width of the second region A2. The width of the sixth trench T may be minutely adjusted by forming the third region A3 with a greater width. Since the mask pattern has different transmittances, the second and third regions A2 and A3 may be formed to have different thicknesses.

A step of forming a photoresist layer and a step of forming a photoresist pattern corresponding to a mask pattern are omitted in FIG. 7A. The filling material layer 150a may be patterned through a direct exposure and a direct etching without the photoresist pattern according to a material property of the filling material layer 150a. An etching material which can etch the filling material layer 150a and cannot etch the first electrodes 121 may be selected for the step of etching the planarizing layer 150a. The planarizing layer 150 may include a second region A2 covering a side surface of the first electrodes 121. The planarizing layer 150 may further include at least one of a first region A1 covering an edge top surface of the first electrodes 121 and a third region A3 covering the second insulating layer 117. The third region A3 may have a width greater than the second region A2. The planarizing layer 150 may be spaced apart from each other by the sixth trench T.

In FIG. 7B, the filling material layer 150a is etched to form the planarizing layer 150 similarly to FIG. 5G.

In FIG. 7C, the sixth trench T is formed in the second insulating layer 117 using the planarizing layer 150 as an etching mask similarly to FIG. 5H.

In FIG. 7D, the organic light emitting layer 130, the second electrode 140, the sealing layer 160, the color filters 171 and 172 and the encapsulation layer 180 are sequentially formed on the planarizing layer 150 having the sixth trench T similarly to FIGS. 5H and 6. The organic light emitting layer 130 has a step difference due to the sixth trench T and the third region A3 of the planarizing layer 150.

At least one of a stack and a charge generating layer of the organic light emitting layer 130 may be formed to have a cut portion at a position where the sidewall surface and the bottom surface of the sixth trench T meet to increase a resistance of the organic light emitting layer 130. As a result, an influence on an adjacent pixel due to a leakage current through the organic light emitting layer 130 may be minimized.

FIGS. 8A to 8E are cross-sectional views showing a method of fabricating an organic light emitting display device according to a third embodiment of the present disclosure. FIGS. 8A to 8E correspond to a line I-I' of FIG. 1.

Steps of forming the transistors 111, the first and second metal layers 114a and 115a, the first electrodes 121 and the filling material layer 150a of the third embodiment are the same as the steps of FIGS. 5A to 5D of the first embodiment.

Figure 8A:
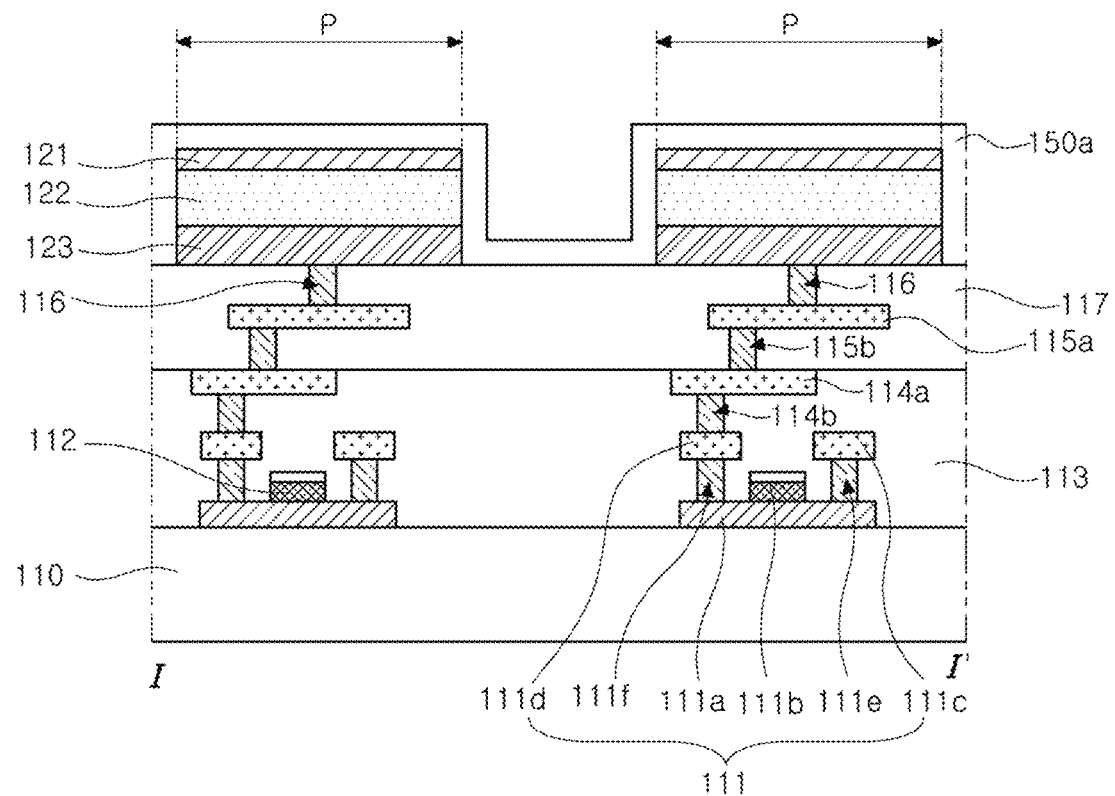
FIGS. 8A, 8B, 8C, 8D, and 8E are cross-sectional views showing a method of fabricating an organic light emitting display device according to a third embodiment of the present disclosure.

In FIG. 8A, the filling material layer 150a is formed according to a step difference of the first electrodes 121 and the second insulating layer 117. Although the filling material layer 150a on the first electrodes 121 and the filling material layer 150a on the second insulating layer 117 may be patterned through one etching step as in FIGS. 5F and 7B, the filling material layer 150a on the first electrodes 121 and the filling material layer 150a on the second insulating layer 117 may be patterned using different photo masks.

Figure 8B:
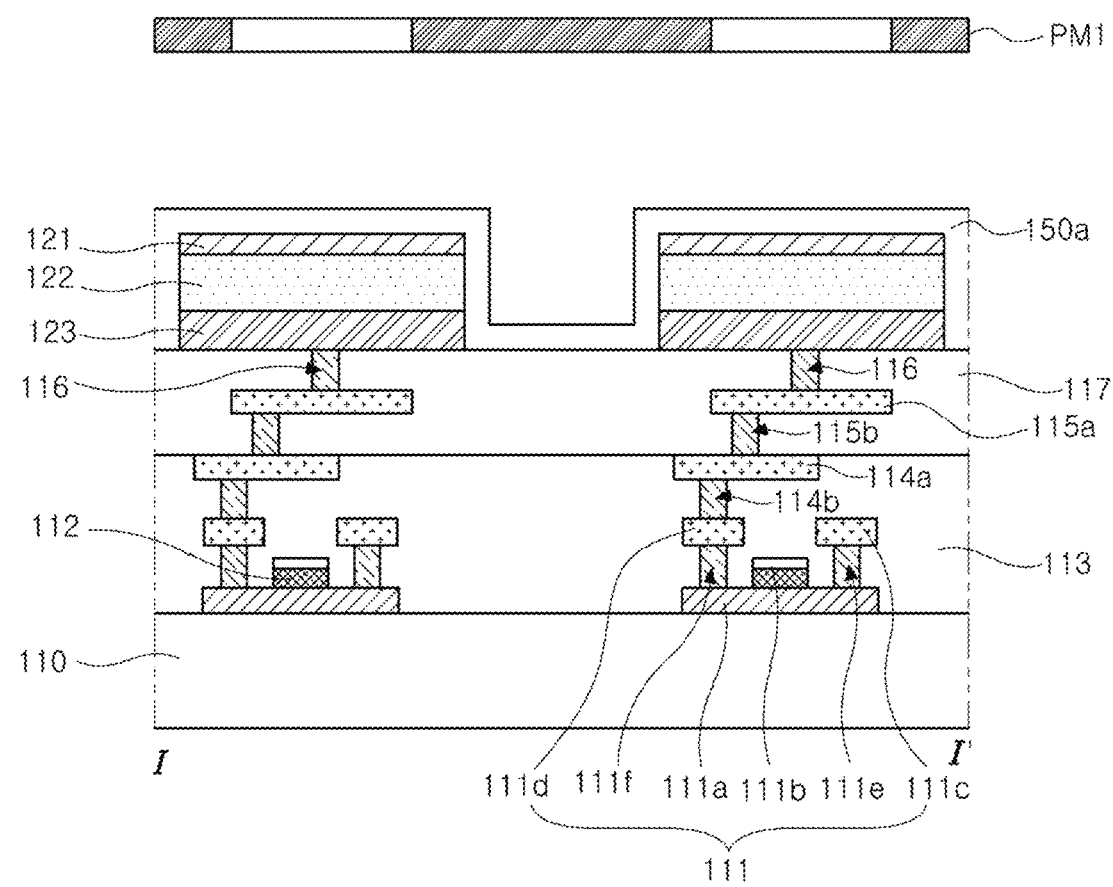

In FIG. 8B, a first photo mask PM1 is disposed over the filling material layer 150a. The first photo mask PM1 may have a mask pattern corresponding to the first electrodes 121.

Figure 8C:
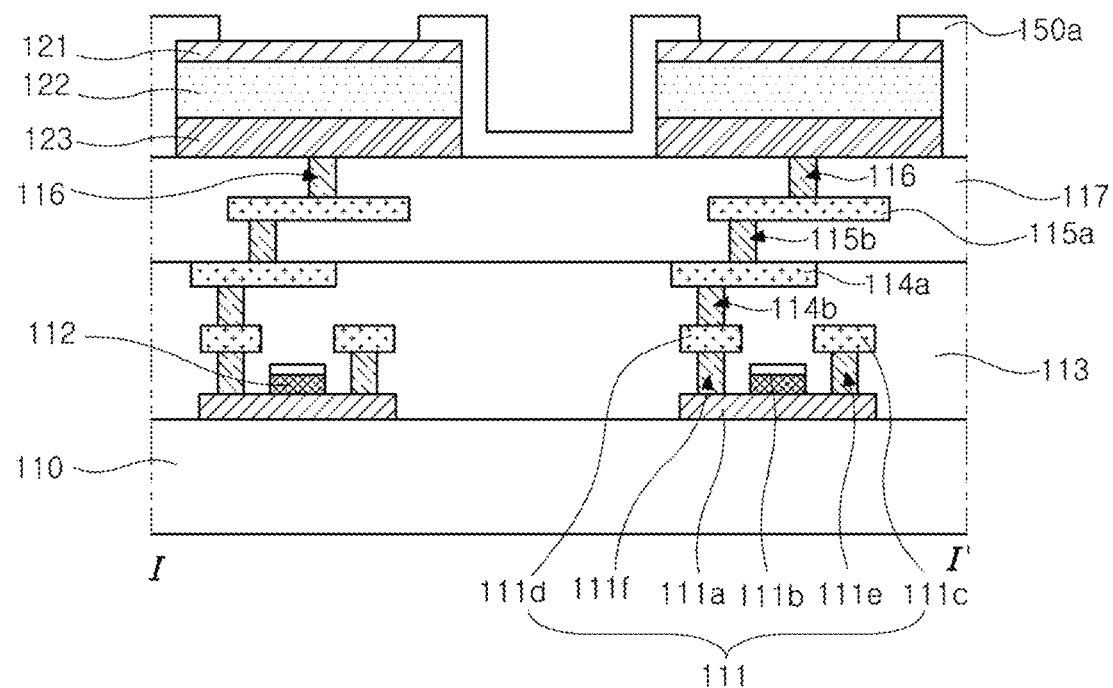

In FIG. 8C, the filling material layer 150a on the first electrodes 121 is patterned to expose the first electrode 121.

Figure 8D:
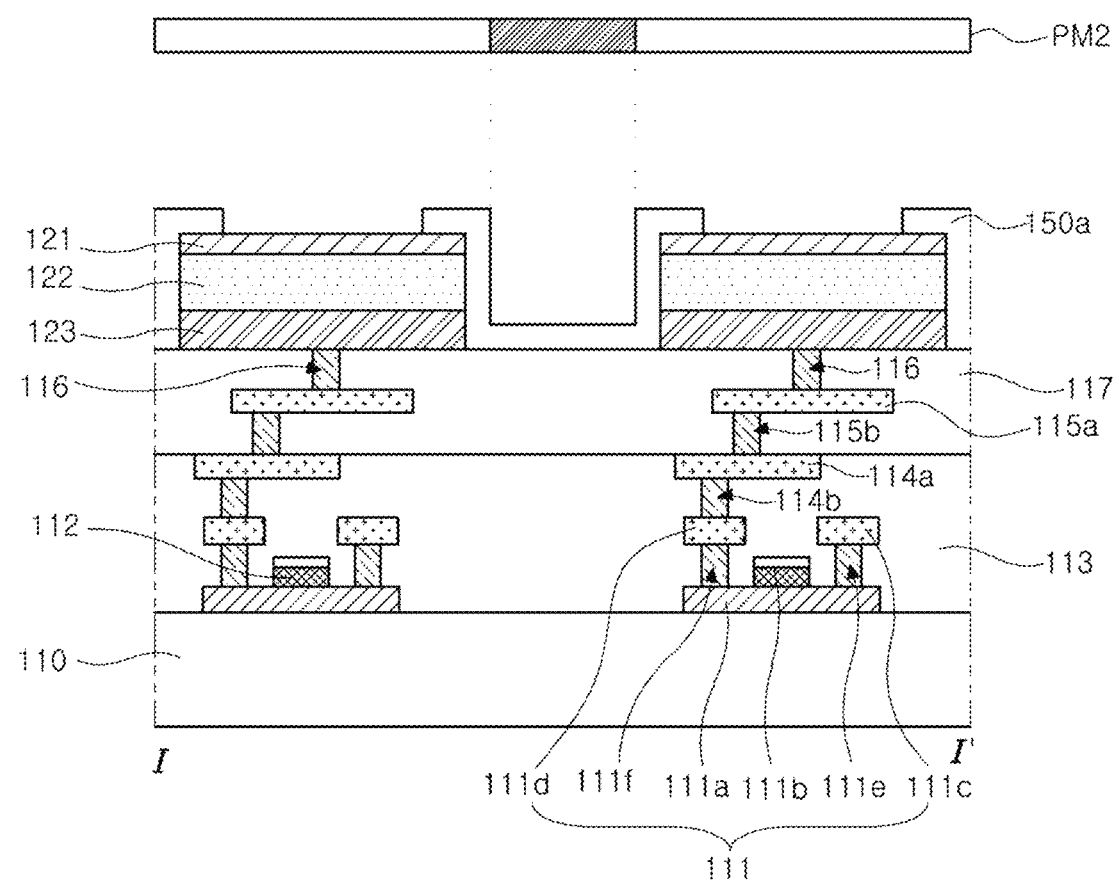

In FIG. 8D, a second photo mask PM2 is disposed over the filling material layer 150a. The second photo mask PM2 has a mask pattern corresponding to the second insulating layer 117 between the first electrodes 121.

Figure 8E:
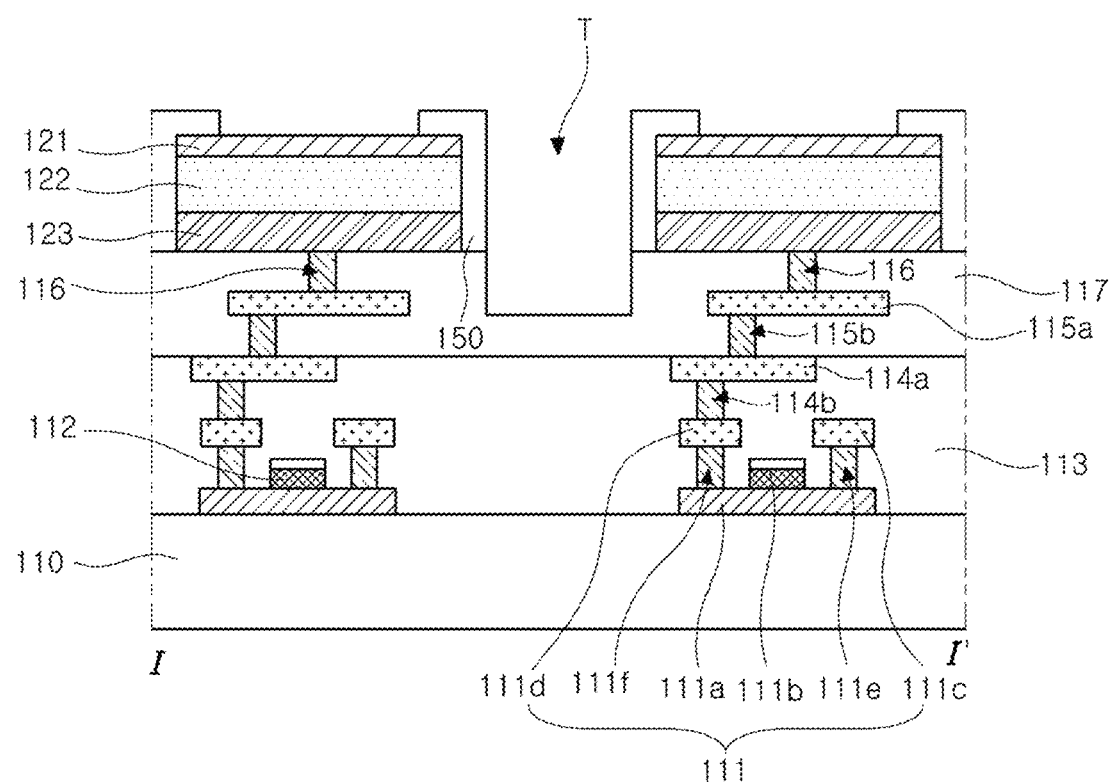

In FIG. 8E, the filling material layer 150a and the second insulating layer 117 are patterned to form the sixth trench T. Since the photoresist pattern covers the first electrodes 121, the first electrodes 121 are protected by the photoresist pattern while the filling material layer 150a and the second insulating layer 117 are patterned. In addition, a further optimized etching material may be used for the step of etching the second insulating layer 117. The etching material for patterning the filling material layer 150a on the first electrode 121 may be different from the etching material for patterning the filling material layer 150a on the second insulating layer 117. Since the second insulating layer 117 and the planarizing layer 150 form the sixth trench T together, a lower edge of the planarizing layer 150 may coincide with an upper edge of the sixth trench T in the second insulating layer 117. The planarizing layer 150 and the second insulating layer 117 may include the sixth trench T commonly.

Figure 9A:
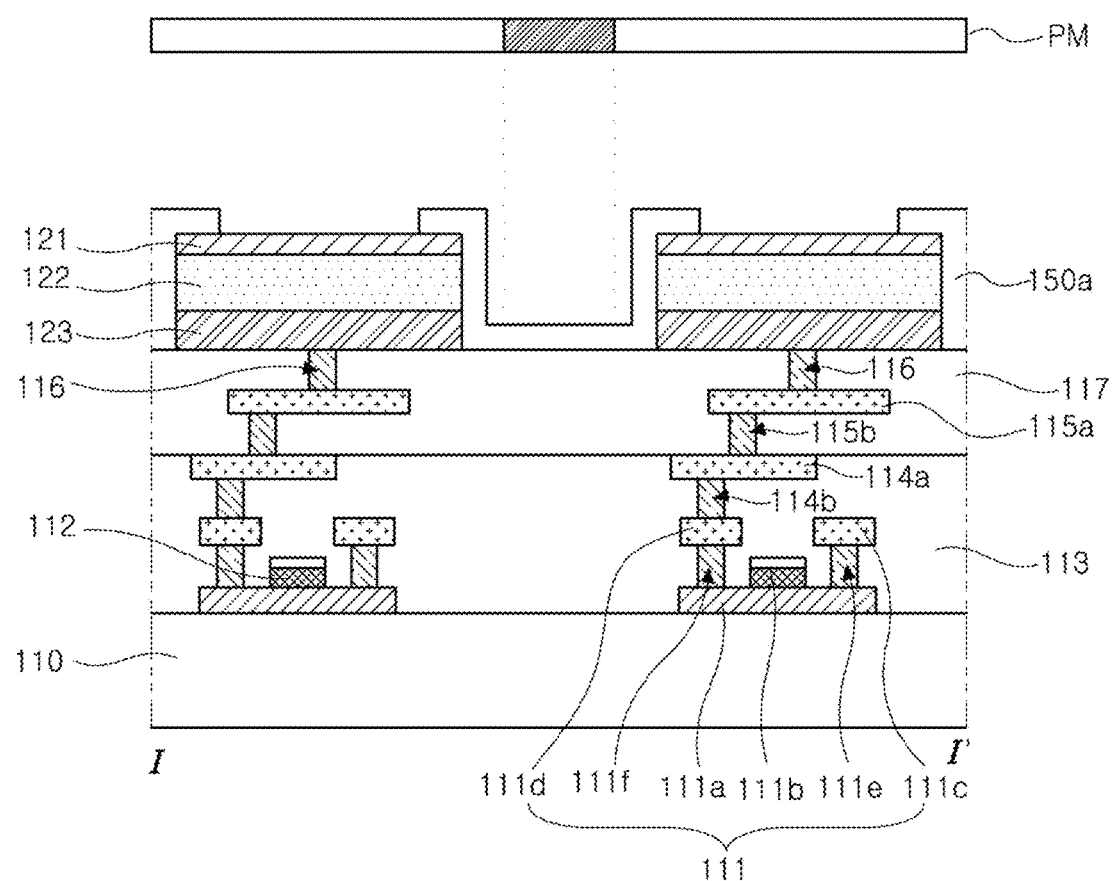
FIGS. 9A and 9B are cross-sectional views showing a method of fabricating an organic light emitting display device according to a fourth embodiment of the present disclosure.
Figure 9B:
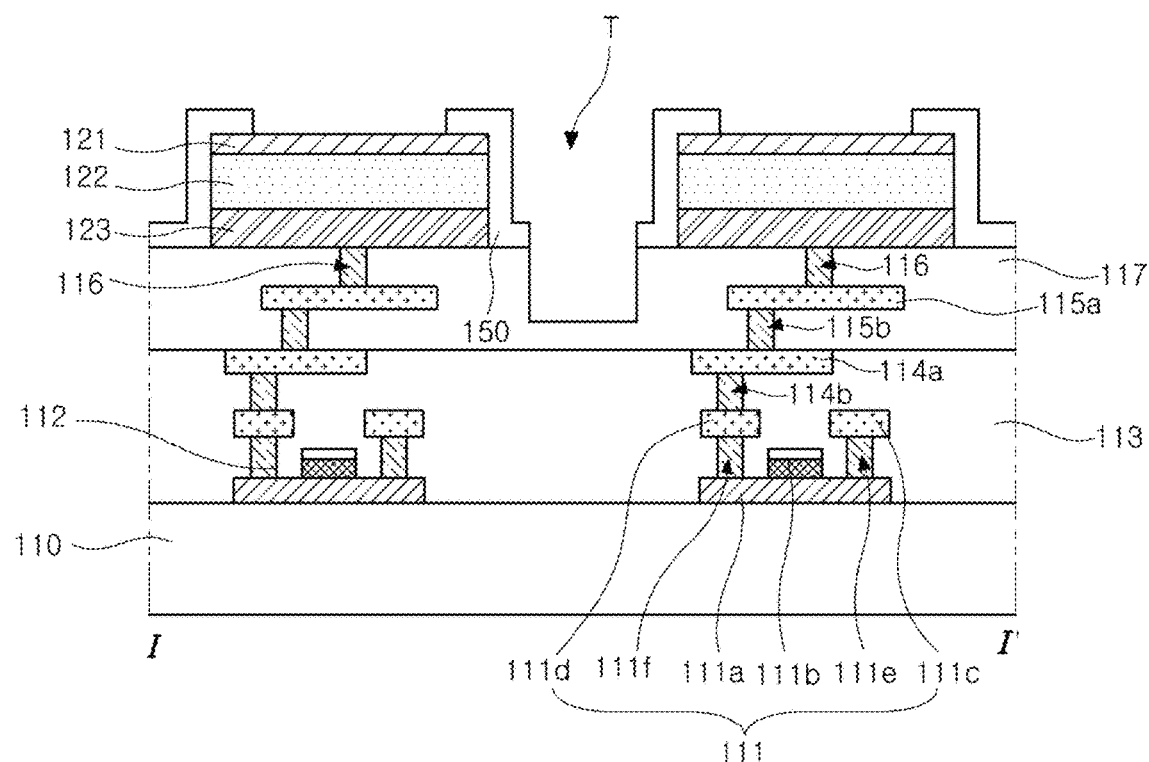

FIGS. 9A and 9B are cross-sectional views showing a method of fabricating an organic light emitting display device according to a fourth embodiment of the present disclosure. FIGS. 9A and 9B correspond to a line I-I' of FIG. 1.

Steps of forming the transistors 111, the first and second metal layers 114a and 115a, the first electrodes 121 and the filling material layer 150a of the fourth embodiment are the same as the steps of FIGS. 5A to 5D of the first embodiment. A step of patterning the filling material layer 150a on the first electrodes 121 of the fourth embodiment is the same as the step of FIG. 8B of the third embodiment.

In FIG. 9A, a photo mask PM is disposed over the filling material layer 150a. The photo mask PM may have a mask pattern corresponding to the second insulating layer 117 between the first electrodes 121. The mask pattern may have a width smaller than a gap distance between the second regions A2 of the planarizing layer 150 covering the side surface of the first electrodes 121.

In FIG. 9B, the planarizing layer 150 and the second insulating layer 117 may be patterned so that the planarizing layer 150 can have the third region A3 contacting the second insulating layer 117 and connected to the second region A2. Since an influence due to the process deviation is reduced as compared with the third embodiment of FIGS. 8A to 8D, the defective proportion is further reduced. In addition, since the sixth trench has a uniform width, the step coverage of the organic light emitting layer 130 and the second electrode 140 is effectively adjusted in subsequent processes. Since the second insulating layer 117 and the planarizing layer 150 form the sixth trench together, a lower edge of the planarizing layer 150 may coincide with an upper edge of the sixth trench T in the second insulating layer 117. The planarizing layer 150 and the second insulating layer 117 may include the sixth trench T commonly.

Figure 10:
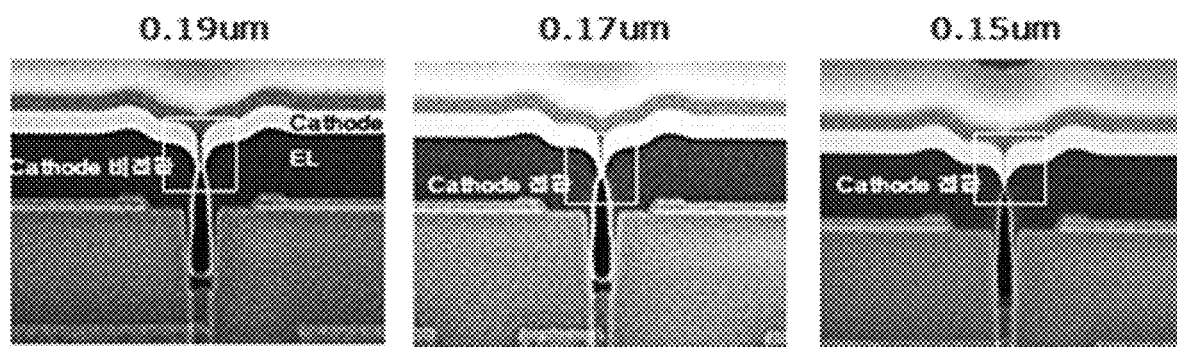
FIG. 10 is photographs showing experimental results of the sixth trench of an organic light emitting display device according to one of first to fourth embodiments of the present disclosure.

FIG. 10 is photographs showing experimental results of the sixth trench of an organic light emitting display device according to one of first to fourth embodiments of the present disclosure.

In FIG. 10, the sixth trench T in the second insulating layer 117 and the planarizing layer 150 may have widths of about 0.19 μm, about 0.17 μm and about 0.15 μm. When the sixth trench has a width of about 0.19 μm, the organic light emitting layer 130 and the second electrode 140 may be formed in the sixth trench T and the second electrode 140 (cathode) may be cut. As a result, the second electrode 140 may be open by sub-pixel to have a relatively high resistance, and the organic light emitting display device may not be driven due to a position deviation. When the sixth trench has a width of about 0.17 μm to about 0.15 μm, the organic light emitting layer 130 is partially cut such that a portion of the organic light emitting layer 130 and the second electrode 140 contact each other. As a result, deterioration due to the sixth trench having a width of about 0.19 μm is prevented.

Figure 11:
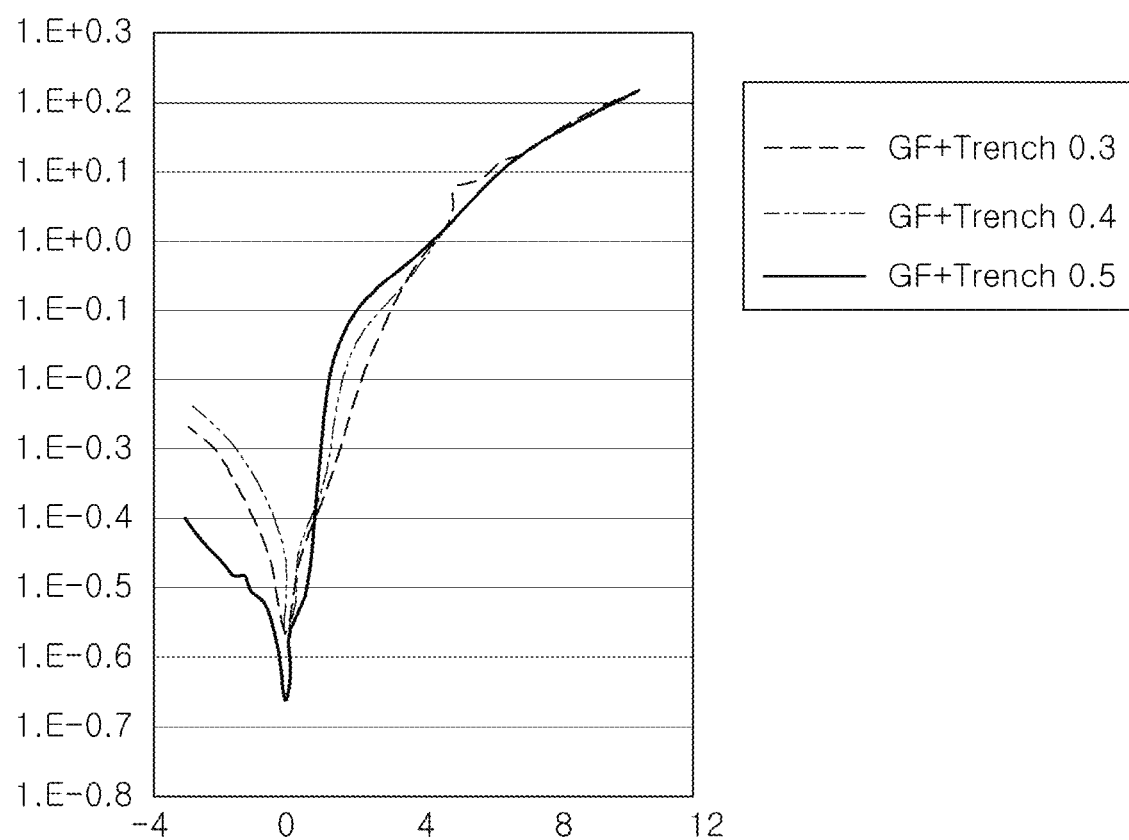
FIG. 11 is a graph showing experimental results of the sixth trench of an organic light emitting display device according to one of first to fourth embodiments of the present disclosure.

FIG. 11 is a graph showing experimental results of the sixth trench of an organic light emitting display device according to one of first to fourth embodiments of the present disclosure.

In FIG. 11, the sixth trench T in the second insulating layer 117 and the planarizing layer 150 may have depths of about 0.3 μm, about 0.4 μm and about 0.5 μm. When the sixth trench T has a depth smaller than about 0.5 μm, a current increases at a voltage smaller than about 0V. Although the diode of the organic light emitting layer 130 should be turned off at a voltage smaller than about 0V, the diode of the organic light emitting layer 130 is turned on due to a leakage current through the side surface. The leakage current may be prevented by cutting the organic light emitting layer 130 for the sixth trench T having a depth greater than about 0.5 μm. Since the resistance of the organic light emitting layer 130 increases by forming at least one of a stack and a charge generating layer of the organic light emitting layer 130, an influence on an adjacent pixel due to a leakage current through the organic light emitting layer 130 may be minimized. As a result, it is preferable for the sixth trench has a depth greater than about 0.5 μm.

Figure 12:
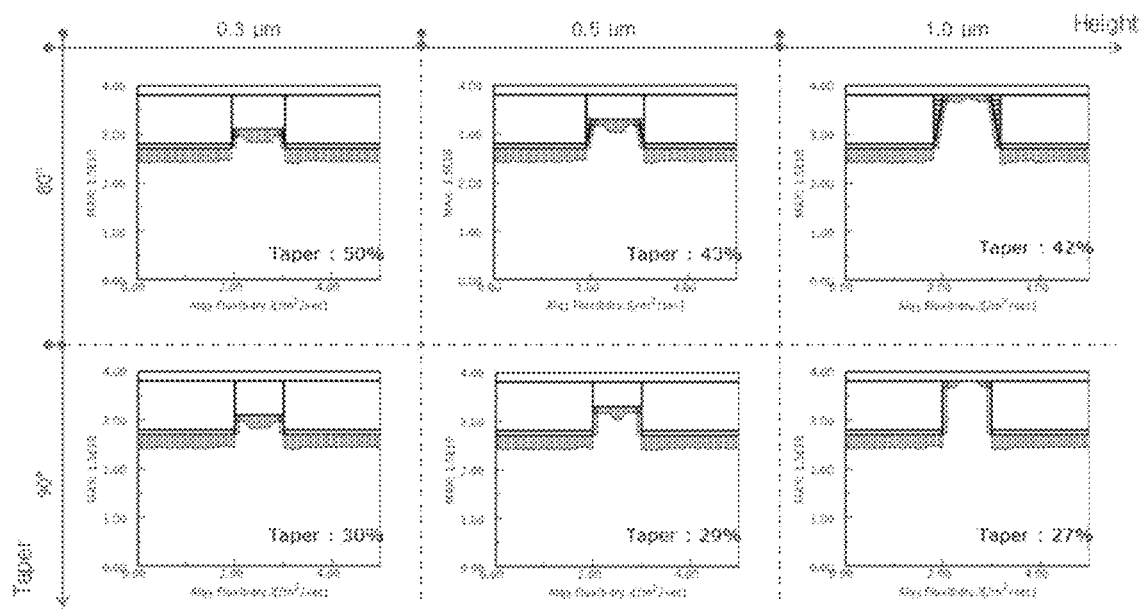
FIG. 12 is a graph showing simulation results of the sixth trench of an organic light emitting display device according to one of first to fourth embodiments of the present disclosure.

FIG. 12 is a graph showing simulation results of the sixth trench of an organic light emitting display device according to one of first to fourth embodiments of the present disclosure.

In FIG. 12, the sixth trench T in the second insulating layer 117 and the planarizing layer 150 may have depths of about 0.3 μm, about 0.5 μm and about 1.0 μm. While the second electrode 140 of bar is continuously formed on the sixth trench T of depths of about 0.3 μm and about 0.5 μm, the second electrode 140 of bar is cut on the sixth trench T of a depth of about 1.0 μm. When the second electrode 140 is cut, the resistance of the second electrode 140 increases as in the experiments of the sixth trench T of various widths, and the organic light emitting display device may not be driven due to a position deviation. As a result, it is preferable for the sixth trench has a depth equal to or smaller than about 1.0 μm.

Figure 13:
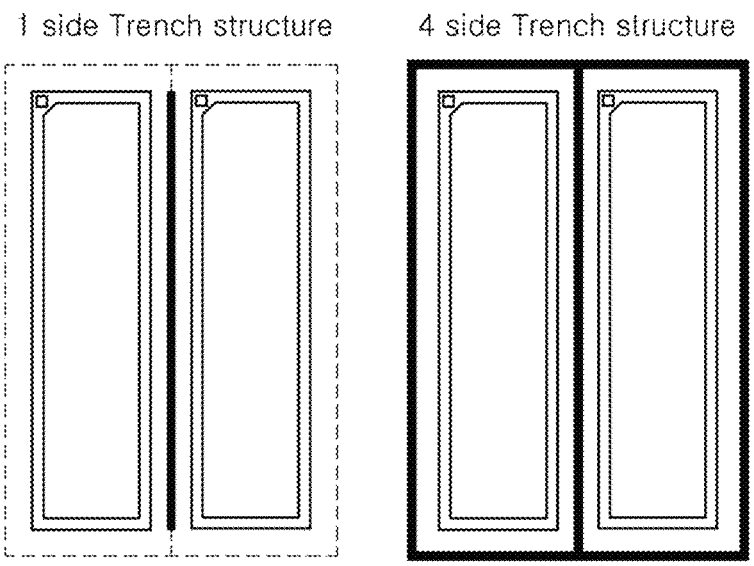
FIG. 13 is a plan view showing an organic light emitting display device according to one of first to fourth embodiments of the present disclosure.

FIG. 13 is a plan view showing an organic light emitting display device according to one of first to fourth embodiments of the present disclosure.

In FIG. 13, the sixth trench T may be formed at one side between the first electrodes 121 or may be formed at four sides of each of the first electrodes 121. When each of the first electrodes 121 has a shape other than a rectangular shape, the sixth trench T may be formed at all sides of each of the first electrodes 121.

Figure 14A:
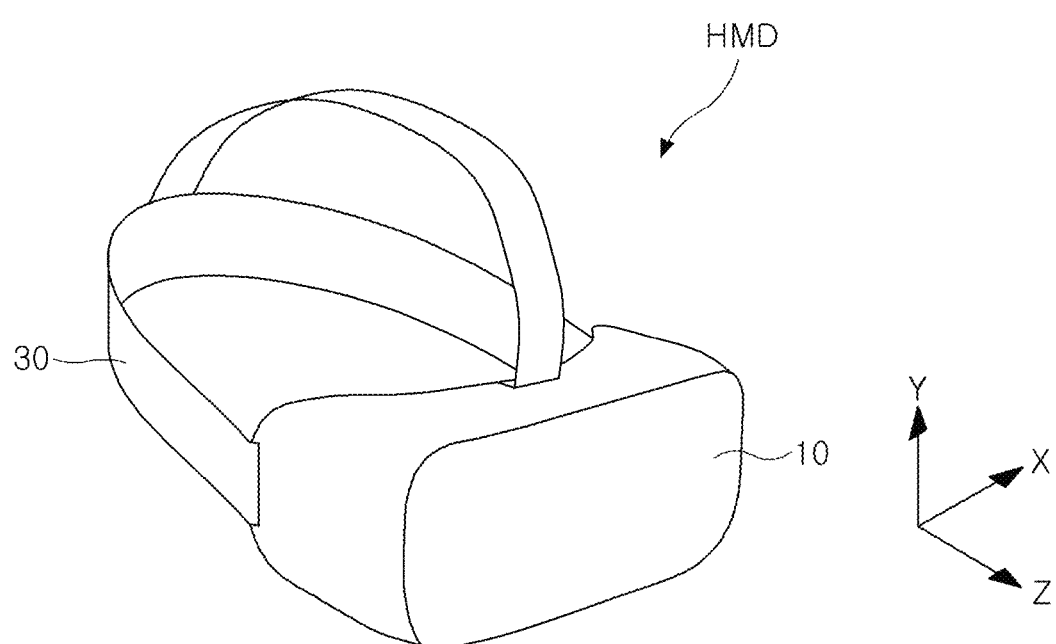
FIGS. 14A and 14B are a perspective view and a plan view showing a head mounted display including an organic light emitting display device according to one of first to fourth embodiments of the present disclosure.
Figure 14B:
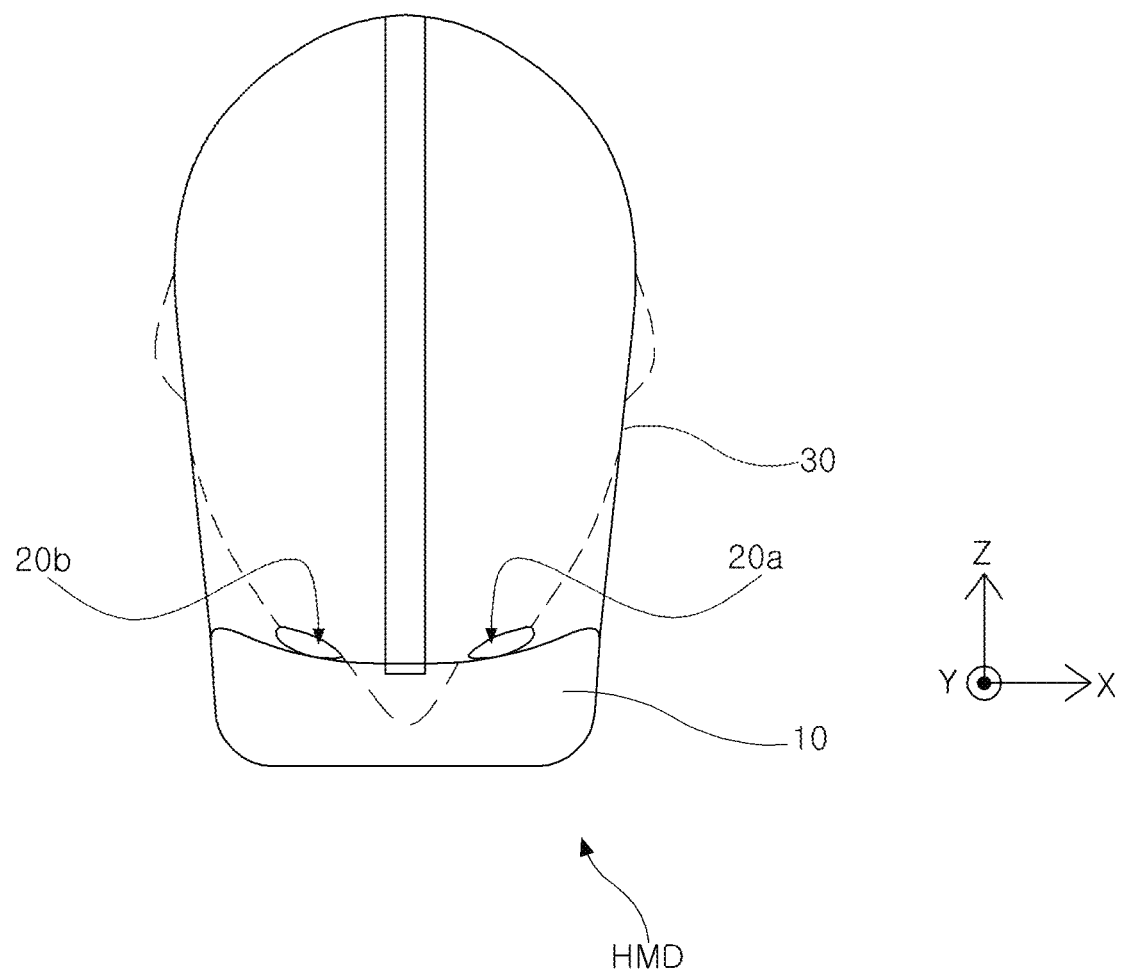

FIGS. 14A and 14B are a perspective view and a plan view showing a head mounted display including an organic light emitting display device according to one of first to fourth embodiments of the present disclosure.

In FIGS. 14A and 14B, a head mounted display HMD including an organic light emitting display device includes a display case 10, a left eye lens 20a, a right eye lens 20b and a head band 30.

The display case 10 accommodates a display device and provides an image of the display device to the left eye lens 20a and the right eye lens 20b. The display device may be an organic light emitting display (OLED) device according to one of first to fourth embodiments of the present disclosure.

The display case 10 may be formed to provide the same image to the left eye lens 20a and the right eye lens 20b. Alternatively, display case 10 may be formed to provide a left eye image and a right eye image to the left eye lens 20a and the right eye lens 20b, respectively. The head mounted display HMD of FIGS. 14A and 14B may be applied to a virtual reality (VR) device.

The head band 30 may be fixed to the display case 10. Although the head band 30 is formed to wrap an upper surface and a side surface of a head of a user in FIG. 14A, the shape of the head band 30 is not limited thereto. The head band 30 is used for fixing the head mounted display HMD to a head of a user. The head band 30 may have a glass shape or a helmet shape in another embodiment.

Figure 15:
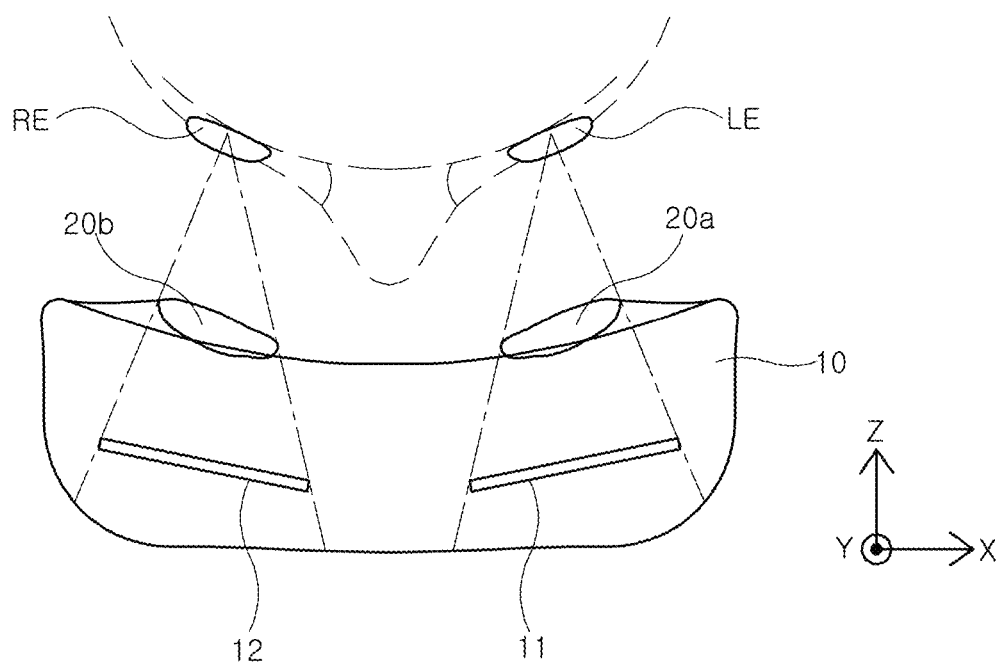
FIG. 15 is a plan view showing a head mounted display including an organic light emitting display device according to one of first to fourth embodiments of the present disclosure.

FIG. 15 is a plan view showing a head mounted display including an organic light emitting display device according to one of first to fourth embodiments of the present disclosure.

In FIG. 15, a head mounted display HMD includes a display case 10, a left eye lens 20a, a right eye lens 20b, a left eye organic light emitting display (OLED) device 11, a right eye organic light emitting display (OLED) device 12 and a head band 30. The left eye OLED device 11 and the right eye OLED device 12 may be disposed in front of the left eye lens 20a and the right eye lens 20b, respectively, in the display case 10. The left eye OLED device 11 and the right eye OLED device 12 may display a left eye image and a right eye image, respectively. The left eye image displayed by the left eye OLED device 11 is transmitted to a left eye LE of a user through the left eye lens 20a, and the right eye image displayed by the right eye OLED device 12 is transmitted to a right eye RE of a user through the right eye lens 20b.

A magnified lens may be further disposed between left eye lens 20a and the left eye OLED device 11 and between the right eye lens 20b and the right eye OLED device 12. The left and right image displayed by the left eye OLED device 11 and the right eye OLED device 12 may be magnified and transmitted to the user. The HMD of FIG. 15 may be applied to an augmented reality (AR) device.

Figure 16:
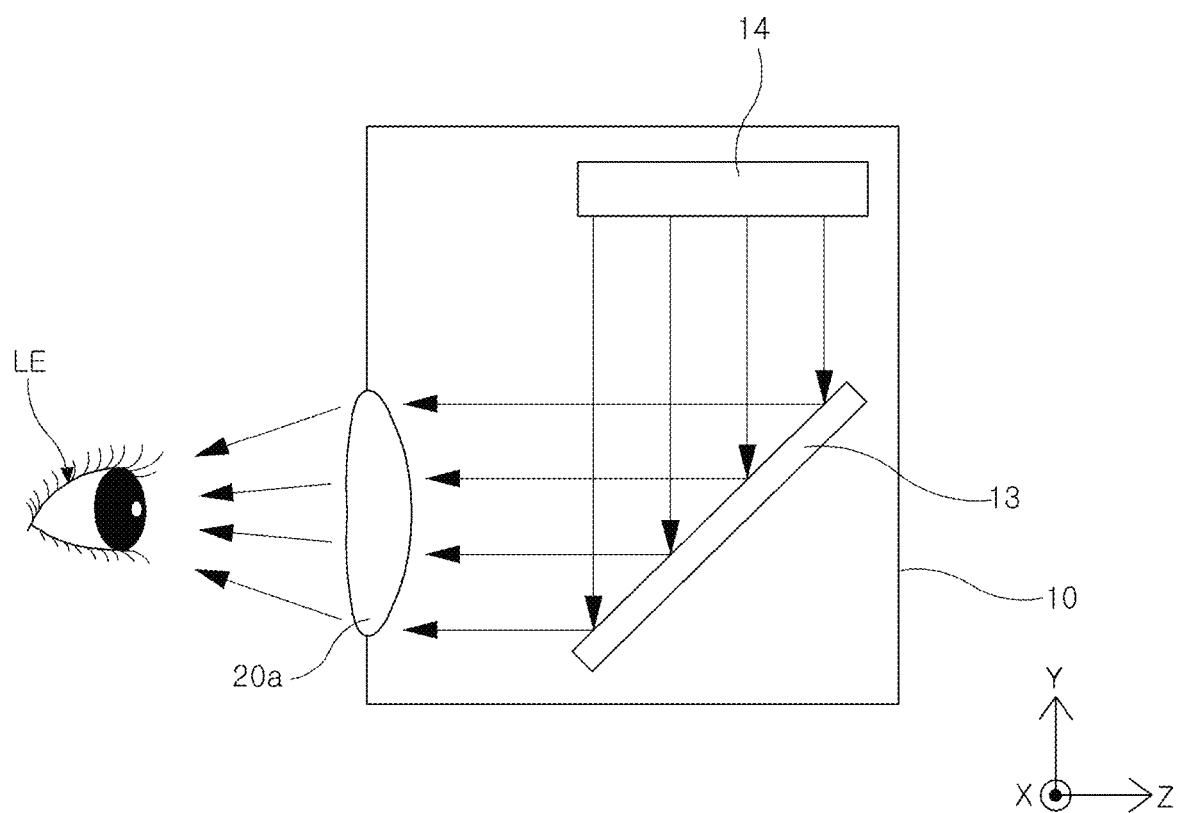
FIG. 16 is a cross-sectional view showing a head mounted display including an organic light emitting display device according to one of first to fourth embodiments of the present disclosure.

FIG. 16 is a cross-sectional view showing a head mounted display including an organic light emitting display device according to one of first to fourth embodiments of the present disclosure.

In FIG. 16, a head mounted display includes a display case 10, a left eye lens 20a, a right eye lens (not shown), a reflecting plate 13 and an organic light emitting display (OLED) device 14. The OLED device 14 displays an image toward the reflecting plate 13, and the reflecting plate 13 reflects the image of the OLED device 14 toward the left eye lens 20a and the right eye lens. As a result, the image of the OLED device 14 is transmitted to a left eye LE of a user through the left eye lens 20a and a right eye of a user through the right eye lens. When a half mirror is used as the reflecting plate 13, the display case 10 may have a thin profile.

In addition, a magnified lens may be further disposed between the left eye lens 20a and the reflecting plate 13 and between the right eye lens and the reflecting plate 13. The image of the OLED device 14 may be magnified and transmitted to the user.

Consequently, in an organic light emitting display device according to an embodiment of the present disclosure, since a planarizing layer is formed between first electrodes to fill a step difference of an insulating layer and the first electrode, a shortage of the first electrode and a charge generating layer or a second electrode at a step difference area between the insulating layer and the first electrode is prevented. Since the planarizing layer partially covers a top surface of the first electrode, generation of a strong electric field between the first and second electrodes is prevented and deterioration of an organic light emitting layer is prevented. A shortage of the first electrode and the organic light emitting layer is prevented.

Since a trench is formed in the planarizing layer, a path of a leakage current between adjacent pixels through the organic light emitting layer may be elongated as compared with an OLED device without a trench. Since the planarizing layer is formed to have a relatively great width in a region where the planarizing layer and the insulating layer contact, a width of the trench in the insulating layer may be adjusted. Since a thickness of the organic light emitting layer on a sidewall of the trench is smaller than a thickness of the organic light emitting layer on a bottom of the trench, a resistance of the organic light emitting layer may increase and an influence on an adjacent pixel due to a leakage current through the organic light emitting layer may be minimized. In addition, since at least one of a stack and a charge generating layer of the organic light emitting layer is formed to have at least one cut portion at a position where the sidewall surface and the bottom surface of the trench meet, a resistance of the organic light emitting layer may increase and an influence on an adjacent pixel due to a leakage current through the organic light emitting layer may be minimized.

It will be apparent to those skilled in the art that various modifications and variations can be made in an organic light emitting display device, a head mounted display including the same and a method of fabricating the same of the present disclosure without departing from the sprit or scope of the disclosure. Thus, it is intended that the present disclosure covers the modifications and variations of these aspects provided they come within the scope of the appended claims and their equivalents.

What is claimed is:

1. An organic light emitting display device, comprising:
an insulating layer;
first electrodes disposed on the insulating layer and spaced from each other by a gap;
a planarizing layer on the first electrodes;
an organic light emitting layer on the first electrodes; and
a second electrode on the organic light emitting layer,
wherein the insulating layer includes a trench in the gap between the first electrodes,
wherein the organic light emitting layer includes a first stack on the first electrodes, a charge generating layer on the first stack, and a second stack on the charge generating layer,
wherein each of the first and second stacks includes a hole transporting layer, at least one emitting material layer and an electron transporting layer, and
wherein the first stack has a discontinuous portion in the trench and at least one of the layers of the second stack has a portion outside the trench that connects continuously with another portion of the at least one of the layers of the second stack over the trench.

2. The organic light emitting display device of claim 1, wherein the second electrode extends continuously over and beyond the trench and has a concave portion corresponding to the trench.

3. The organic light emitting display device of claim 1, further comprising color filters over the second electrode, wherein the color filters correspond to the first electrodes, respectively.

4. The organic light emitting display device of claim 1, wherein the planarizing layer includes a first region covering a portion of a top surface of the first electrodes.

5. The organic light emitting display device of claim 1, wherein the planarizing layer includes a second region covering a side surface of the first electrodes and a third region contacting the insulating layer and connected to the second region.

6. The organic light emitting display device of claim 5, wherein a width of the third region is greater than a width of the second region.

7. The organic light emitting display device of claim 5, wherein a top surface of the third region is disposed in a level under a top surface of the first electrodes.

8. The organic light emitting display device of claim 1, further comprising:
transistors under the insulating layer, the transistors corresponding to the first electrodes, respectively;
first metal layers connected to the transistors, respectively; and
second metal layers connected to the first metal layers, respectively.

9. The organic light emitting display device of claim 8, wherein a bottom surface of the trench is disposed in a level under a bottom surface of the second metal layer.

10. The organic light emitting display device of claim 1, wherein the charge generating layer has a discontinuous portion in the trench.

11. An organic light emitting display device, comprising:
a first sub-pixel including a first electrode of the first sub-pixel covering an insulating layer of the first sub-pixel;
a second sub-pixel including a first electrode of the second sub-pixel covering an insulating layer of the second sub-pixel; and
a trench between the first sub-pixel and the second sub-pixel that extends down through at least part of an insulating layer between the first sub-pixel and the second sub-pixel, wherein the insulating layer of the first sub-pixel, the insulating layer of the second sub-pixel, and the insulating layer between the first sub-pixel and the second sub-pixel are part of a same layer, wherein an organic light emitting layer is disposed on the first electrode and includes a first stack on the first electrodes, a charge generating layer on the first stack, and a second stack on the charge generating layer, wherein each of the first and second stacks includes a hole transporting layer, at least one emitting material layer and an electron transporting layer, and wherein the first stack has a discontinuous portion in the trench and at least one of the layers of the second stack has a portion outside the trench that connects continuously with another portion of the at least one of the layers of the second stack over the trench.

12. The organic light emitting display device of claim 11, wherein the second electrode extends continuously over and beyond the trench and has a concave portion corresponding to the trench.

13. The organic light emitting display device of claim 11, further comprising color filters over the second electrode, wherein the color filters correspond to the first electrodes, respectively.

14. The organic light emitting display device of claim 11, wherein a planarizing layer includes a tail contacting the insulating layer, and a top surface of the tail is disposed in a level under a top surface of the first electrodes.

15. The organic light emitting display device of claim 11, further comprising:
  transistors under the insulating layer, the transistors corresponding to the first electrodes, respectively;
  first metal layers connected to the transistors, respectively; and
  second metal layers connected to the first metal layers, respectively.

16. The organic light emitting display device of claim 15, wherein a bottom surface of the trench is disposed in a level under a bottom surface of the second metal layer.

17. An organic light emitting display device, comprising:
  an insulating layer;
  first electrodes disposed on the insulating layer and spaced from each other by a gap;
  a planarizing layer on the first electrodes;
  an organic light emitting layer on the first electrodes; and
  a second electrode on the organic light emitting layer,
  wherein the insulating layer includes a trench in the gap between the first electrodes,
  wherein the organic light emitting layer includes a first stack on the first electrodes, a charge generating layer on the first stack, and a second stack on the charge generating layer,
  wherein each of the first and second stacks includes a hole transporting layer, at least one emitting material layer and an electron transporting layer, and
  wherein the first stack has a discontinuous portion in the trench and at least one of the layers of the second stack extends continuously over and beyond the trench without a discontinuous portion.

18. The organic light emitting display device of claim 17, wherein at least one of the layers of the second stack has a portion outside the trench that connects continuously with another portion of the at least one of the layers of the second stack over the trench.

* * * * *